United States Patent
Sato et al.

(10) Patent No.: US 8,436,395 B2
(45) Date of Patent: May 7, 2013

(54) SEMICONDUCTOR LIGHT EMITTING DEVICE

(75) Inventors: Takahiro Sato, Kanagawa-ken (JP); Shigeya Kimura, Kanagawa-ken (JP); Taisuke Sato, Kanagawa-ken (JP); Toshihide Ito, Tokyo (JP); Koichi Tachibana, Kanagawa-ken (JP); Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/405,961

(22) Filed: Feb. 27, 2012

(65) Prior Publication Data

US 2013/0001584 A1 Jan. 3, 2013

(30) Foreign Application Priority Data

Jun. 28, 2011 (JP) .................................. 2011-143505

(51) Int. Cl.
*H01L 33/36* (2010.01)
(52) U.S. Cl.
USPC ........................ 257/99; 257/E33.065; 438/42
(58) Field of Classification Search .................... 257/99, 257/E33.065; 438/42
See application file for complete search history.

(56) References Cited

U.S. PATENT DOCUMENTS

| | | |
|---|---|---|
| 2002/0024053 A1* | 2/2002 | Inoue et al. ..................... 257/79 |
| 2003/0116770 A1* | 6/2003 | Chang et al. .................... 257/79 |
| 2005/0104074 A1* | 5/2005 | Kim et al. ........................ 257/79 |
| 2008/0048194 A1* | 2/2008 | Kudo et al. ..................... 257/94 |
| 2010/0044744 A1* | 2/2010 | Kim et al. ....................... 257/99 |

FOREIGN PATENT DOCUMENTS

JP 2006-210961 8/2006

* cited by examiner

*Primary Examiner* — Steven J Fulk
(74) *Attorney, Agent, or Firm* — Oblon, Spivak, McClelland, Maier & Neustadt, L.L.P.

(57) ABSTRACT

According to one embodiment, a semiconductor light emitting device includes a stacked structure unit, a transparent, p-side and n-side electrodes. The unit includes n-type semiconductor layer, a light emitting portion provided on a part of the n-type semiconductor layer and p-type semiconductor layer provided on the light emitting portion. The transparent electrode is provided on the p-type semiconductor layer. The p-side electrode is provided on the transparent electrode. The n-side electrode is provided on the n-type semiconductor layer. The transparent electrode has a hole provided between the n-side and p-side electrodes. A width of the hole along an axis perpendicular to an axis from the p-side electrode toward the n-side electrode is longer than widths of the n-side and p-side electrodes. A distance between the hole and the n-side electrode is not longer than a distance between the hole and the p-side electrode.

20 Claims, 15 Drawing Sheets

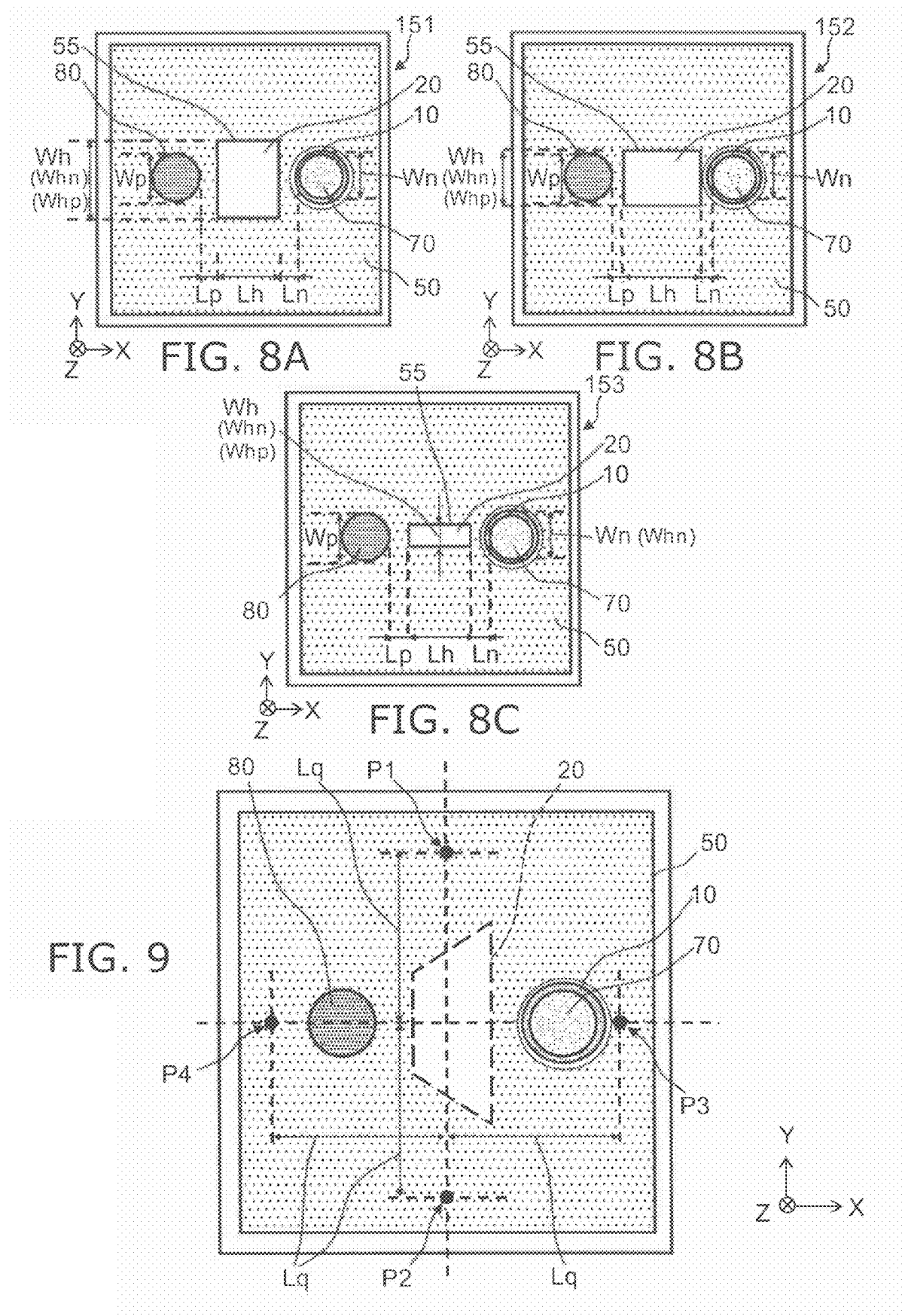

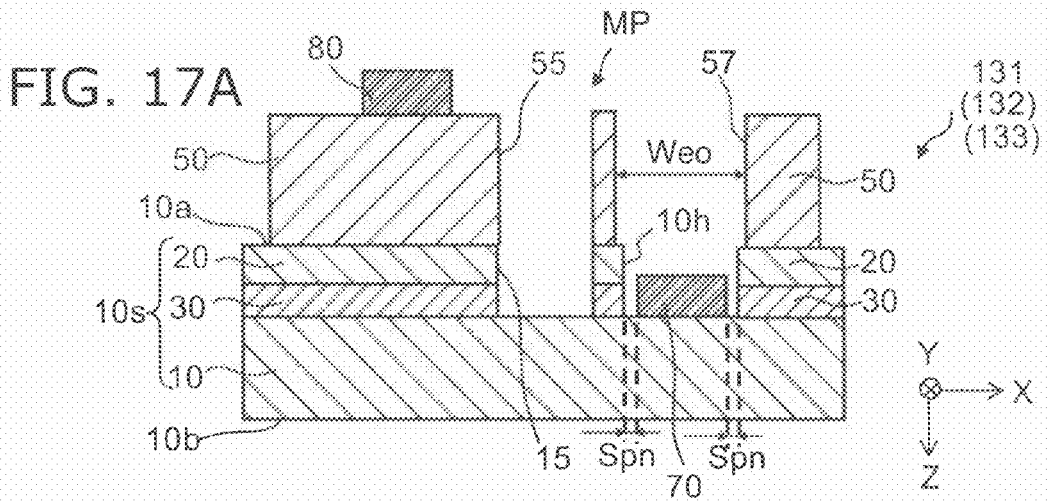
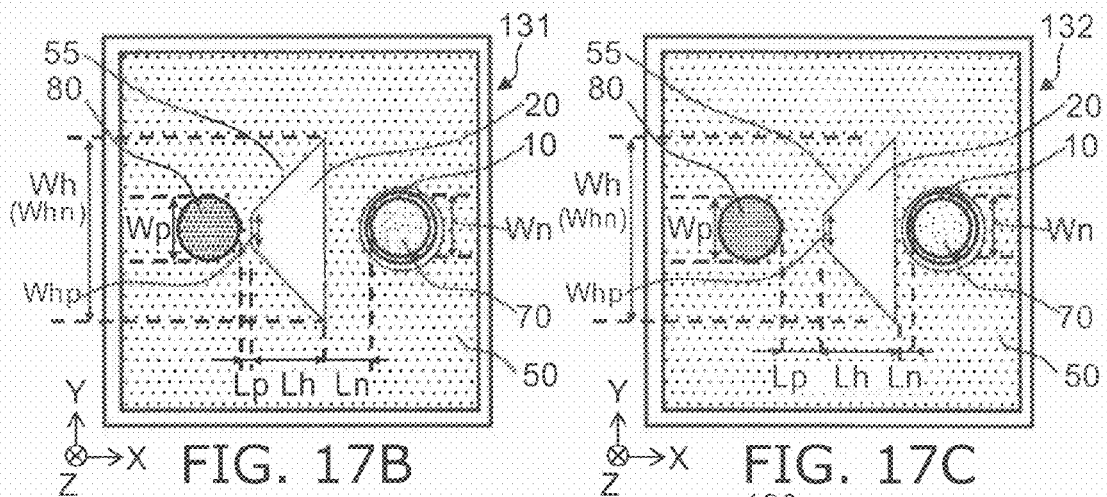
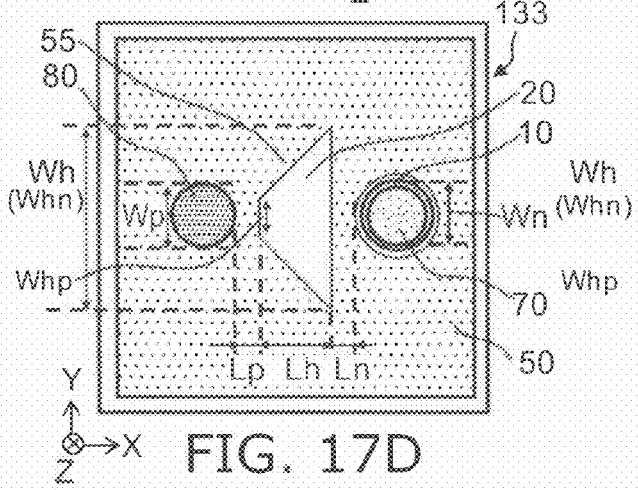

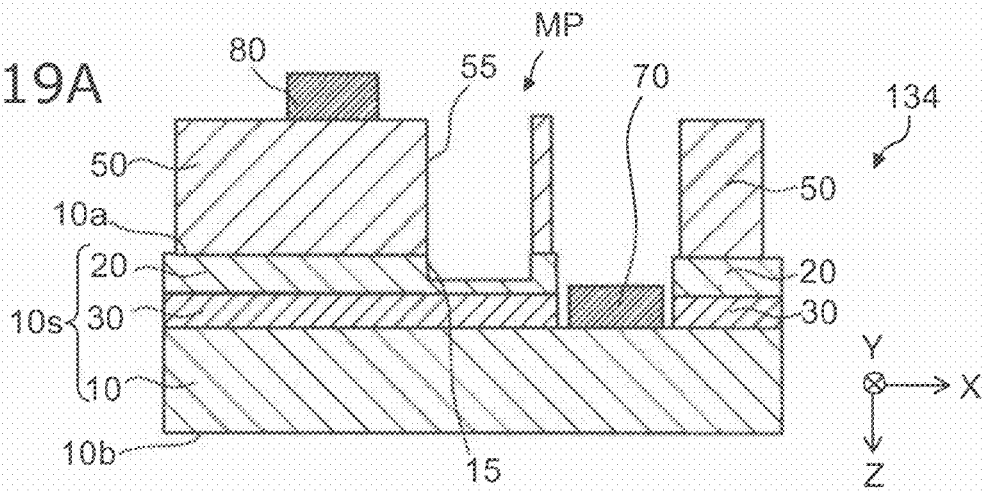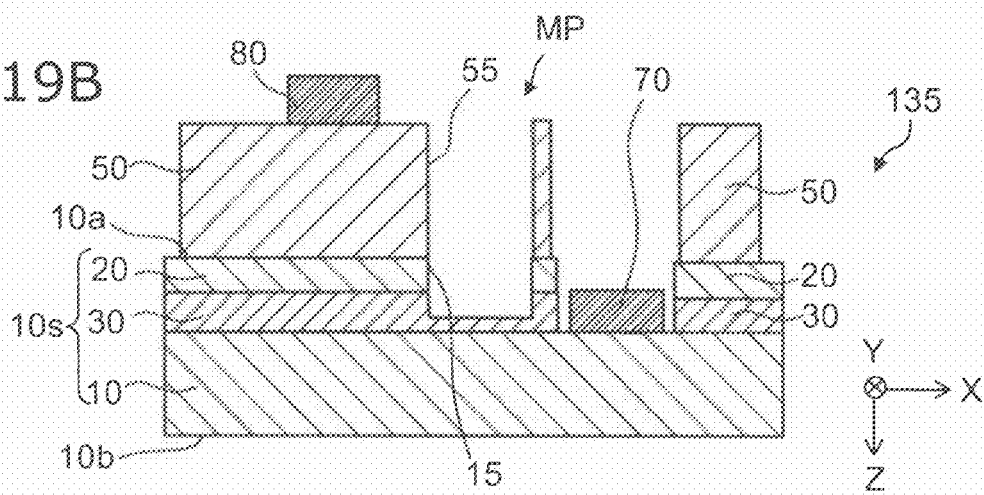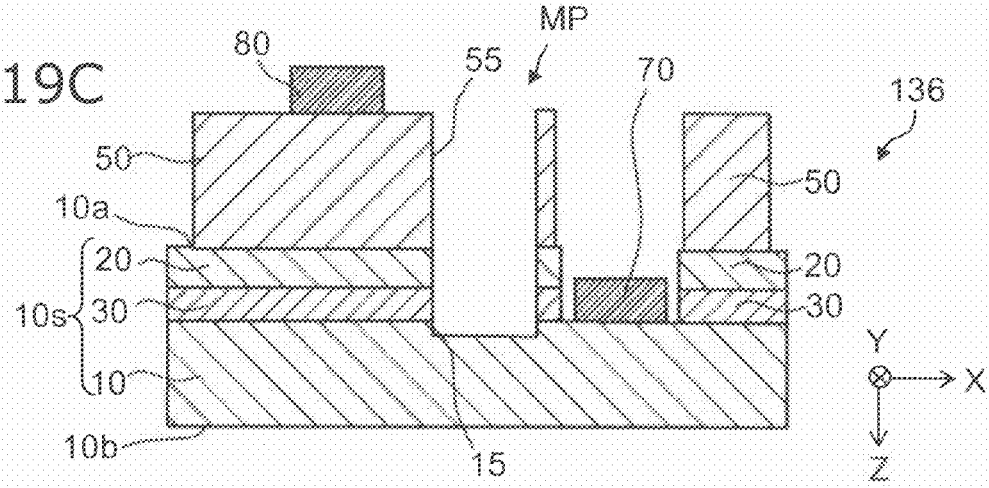

US 8,436,395 B2

SEMICONDUCTOR LIGHT EMITTING DEVICE

CROSS-REFERENCE TO RELATED APPLICATIONS

This application is based upon and claims the benefit of priority from the prior Japanese Patent Application No. 2011-143505, filed on Jun. 28, 2011; the entire contents of which are incorporated herein by reference.

FIELD

Embodiments described herein relate generally to a semiconductor light emitting device.

BACKGROUND

Semiconductor light emitting devices are applied to a blue LED (Light Emitting Diode) or the like, for example, and white color LEDs using the semiconductor light emitting device are applied to LED lighting or the like. It is desired for the semiconductor light emitting device to improve efficiency and to obtain high output light emission.

BRIEF DESCRIPTION OF THE DRAWINGS

FIG. 8A to FIG. 8C are schematic plan views illustrating the configurations of semiconductor light emitting devices;

FIG. 9 is a schematic plan view illustrating evaluation positions of the characteristics of the semiconductor light emitting device;

FIG. 17A to FIG. 17D are schematic views illustrating the configuration of another semiconductor light emitting devices according to the embodiment;

FIG. 19A to FIG. 19C are schematic cross-sectional views illustrating the configuration of another semiconductor light emitting devices according to the embodiment.

DETAILED DESCRIPTION

Figure 1A:
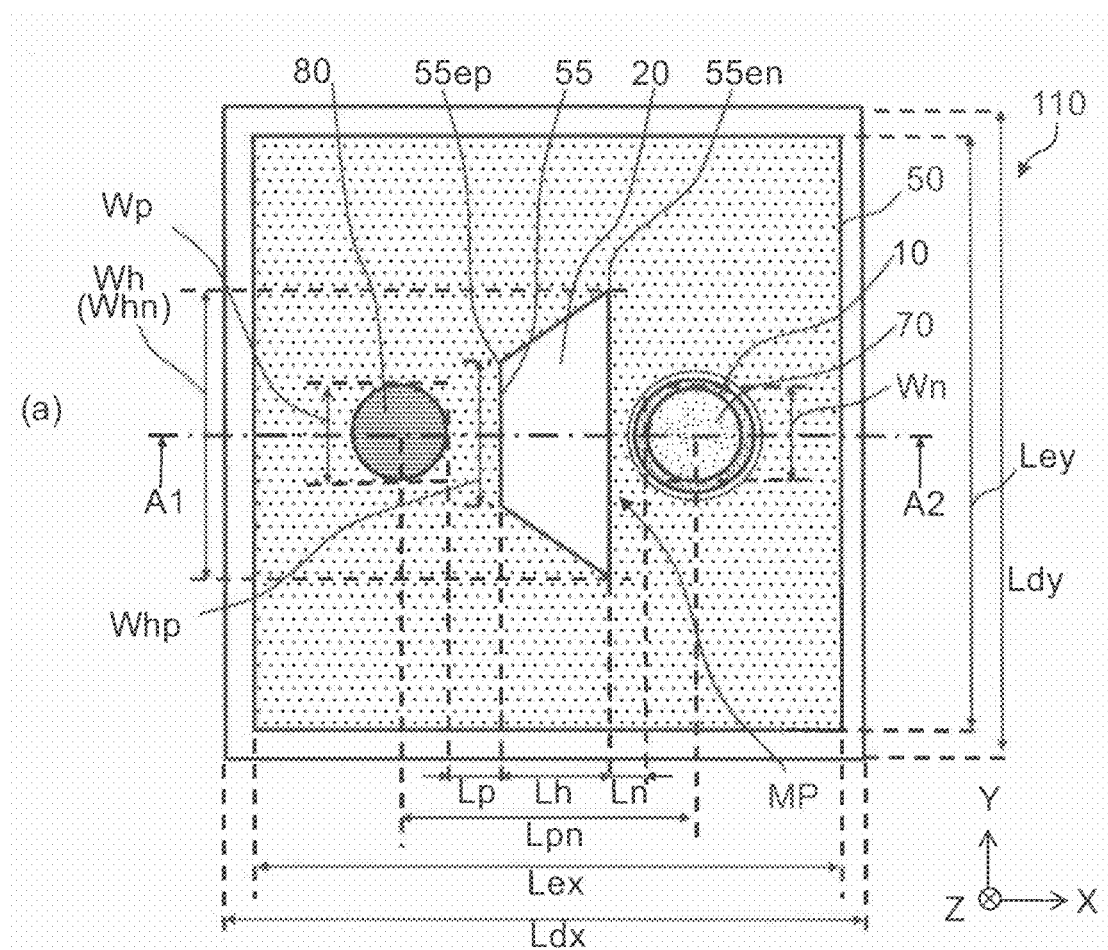
FIG. 1A and FIG. 1B are schematic views illustrating a semiconductor light emitting device according to an embodiment.

According to one embodiment, a semiconductor light emitting device includes a stacked structure unit, a transparent electrode, a p-side electrode and an n-side electrode. The stacked structure unit includes: an n-type semiconductor layer; a light emitting portion provided on a part of the n-type semiconductor layer; and a p-type semiconductor layer provided on the light emitting layer. An axis from the p-type semiconductor layer toward the n-type semiconductor is defined as a first axis. The transparent electrode is provided on the p-type semiconductor layer and electrically connected to the p-type semiconductor layer. The p-side electrode is provided on the transparent electrode and electrically connected to the transparent electrode. The n-side electrode is provided on the n-type semiconductor layer and electrically connected to the n-type semiconductor layer. An axis from the p-side electrode toward the n-side electrode is defined as a second axis. The transparent electrode has a hole provided between the n-side electrode and the p-side electrode. The hole penetrates the transparent electrode along the first axis. A width of the hole along a third axis is longer than a width of the n-side electrode along the third axis and is longer than a width of the p-side electrode along the third axis. The third axis is perpendicular to the second axis and is perpendicular to the first axis. A distance between the hole and the n-side electrode along the second axis is not longer than a distance between the hole and the p-side electrode along the second axis.

According to another embodiment, a semiconductor light emitting device includes a stacked structure unit, a transparent electrode, a p-side electrode and an n-side electrode. The stacked structure unit includes: an n-type semiconductor layer; a light emitting portion provided on a part of the n-type semiconductor layer; and a p-type semiconductor layer provided on the light emitting portion. An axis from the p-type semiconductor layer toward the n-type semiconductor is defined as a first axis. The transparent electrode is provided on the p-type semiconductor layer and electrically connected to the p-type semiconductor layer. The p-side electrode is provided on the transparent electrode and electrically connected to the transparent electrode. The n-side electrode is provided on the n-type semiconductor layer and electrically connected to the n-type semiconductor layer. An axis from the p-side electrode toward the n-side electrode is defined as a second axis. The transparent electrode has a hole provided between the n-side electrode and the p-side electrode. The hole penetrates the transparent electrode along the first axis. A width of the hole along a third axis is longer than a width of the n-side electrode along the third axis and is longer than a width of the p-side electrode along the third axis. The third axis is perpendicular to the second axis and is perpendicular to the first axis. A width of the hole on a side of the n-side electrode along the third axis is longer than a width of the hole on a side of the p-side electrode along the third axis.

Various embodiments will be described hereinafter with reference to the accompanying drawings.

The drawings are schematic or conceptual; and the relationships between the thickness and width of portions, the proportional coefficients of sizes among portions, etc., are not necessarily the same as the actual values thereof. Further, the dimensions and proportional coefficients may be illustrated differently among drawings, even for identical portions.

In the specification and drawings, components similar to those described or illustrated in a drawing thereinabove are marked with like reference numerals, and a detailed description is omitted as appropriate.

Figure 1B:
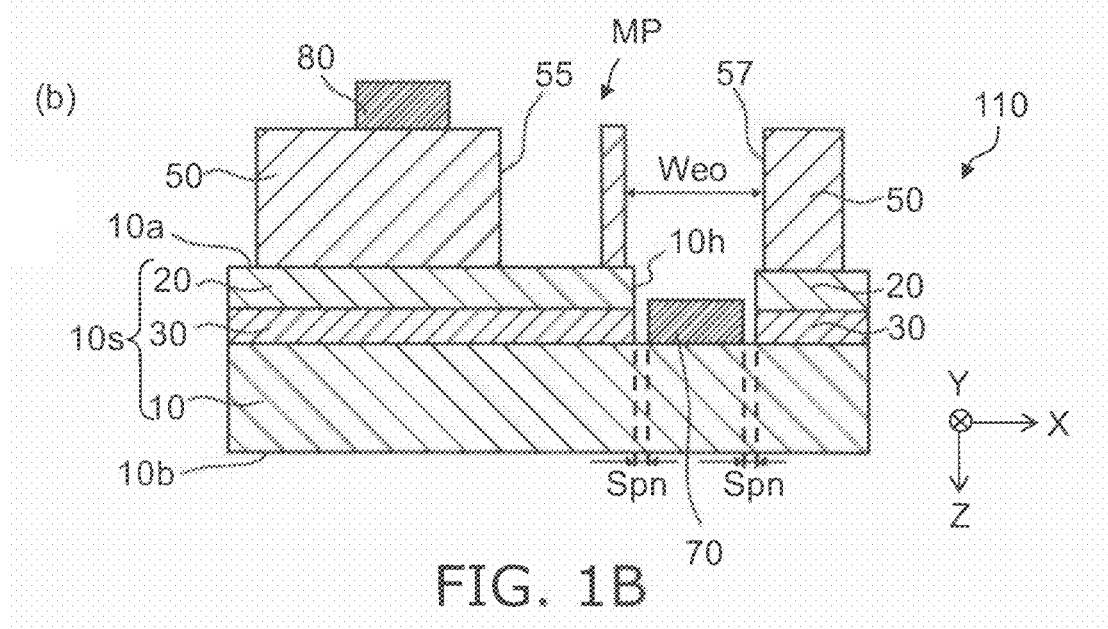

FIG. 1A and FIG. 1B are schematic views illustrating the configuration of a semiconductor light emitting device according to an embodiment.

FIG. 1A is a schematic plan view. FIG. 1B is a cross-sectional view on a line A1-A2 of FIG. 1A. As illustrated in FIG. 1A and FIG. 1B, a semiconductor light emitting device 110 according to the embodiment includes a stacked structure unit 10s, a transparent electrode 50, a p-side electrode 80, and an n-side electrode 70.

The stacked structure unit 10s includes an n-type semiconductor layer 10, a p-type semiconductor layer 20, and a light emitting portion 30. The p-type semiconductor layer 20 is faced to a part of the n-type semiconductor layer 10. The light emitting portion 30 is provided between that part of the n-type semiconductor layer 10 and the p-type semiconductor layer 20.

The stacked structure unit 10s has a first major surface 10a and a second major surface 10b. The first major surface 10a is the major surface of the stacked structure unit 10s on the p-type semiconductor layer 20 side. The second major surface 10b is the major surface of the stacked structure unit 10s on the n-type semiconductor layer 10 side. The second major surface 10b is the major surface opposite the first major surface 10a.

The transparent electrode 50 is electrically connected to the p-type semiconductor layer 20 on the first major surface 10a of the stacked structure unit 10s. More specifically, the transparent electrode 50 contacts with the p-type semiconductor layer 20.

The p-side electrode 80 is provided on the transparent electrode 50 opposite the p-type semiconductor layer 20. The p-side electrode 80 is electrically connected to the transparent electrode 50. Namely, the transparent electrode 50 is disposed between the p-side electrode 80 and the p-type semiconductor layer 20. The p-side electrode 80 is a p-side pad electrode, for example.

The n-side electrode 70 is electrically connected to the part of the n-type semiconductor layer 10 on the first major surface 10a. The n-side electrode 70 is an n-side pad electrode, for example.

Namely, in the stacked structure unit 10s, a part of the n-type semiconductor layer 10 is exposed in the first major surface 10a. The n-side electrode 70 is provided on the exposed portion.

Thus, the stacked structure unit 10s includes: an n-type semiconductor layer 10; a light emitting portion 30 provided on a part of the n-type semiconductor layer 10; and a p-type semiconductor layer 20 provided on the light emitting layer 30. The transparent electrode 50 is provided on the p-type semiconductor layer 20 and electrically connected to the p-type semiconductor layer 20. The p-side electrode 80 is provided on the transparent electrode 50 and electrically connected to the transparent electrode 50. The n-side electrode 70 is provided on the n-type semiconductor layer 10 and electrically connected to the n-type semiconductor layer 10.

A voltage is applied between the p-side electrode 80 and the n-side electrode 70, so that a current is supplied to the light emitting portion 30 through the transparent electrode 50, the p-type semiconductor layer 20, and the n-type semiconductor layer 10, and light (emitted light) is emitted from the light emitting portion 30.

The transparent electrode 50 is transparent to the emitted light. The transparent electrode 50 includes an oxide containing at least one element selected from a group consisting of In, Sn, Zn, and Ti, for example. More specifically, an indium tin oxide (ITO) film, for example, is used for the transparent electrode 50. The thickness of the transparent electrode 50 ranges from 0.1 micrometer ($\mu$m) to 0.5 $\mu$m, for example. The thickness of the transparent electrode 50 is about 0.4 $\mu$m, for example.

A stacked film made of a Ti film, Pt film, and Au film, for example, is used for the p-side electrode 80 and the n-side electrode 70. The embodiment is not limited thereto. Materials used for the p-side electrode 80 and the n-side electrode 70 are optional.

The n-type semiconductor layer 10 and the p-type semiconductor layer 20 include a nitride semiconductor, for example. An n-type GaN layer, for example, is used for the n-type semiconductor layer 10, and a p-type GaN layer, for example, is used for the p-type semiconductor layer 20. However, in the embodiment, materials used for the n-type semiconductor layer 10 and the p-type semiconductor layer 20 are optional.

Here, suppose that a direction from the p-type semiconductor layer 20 toward the n-type semiconductor layer 10 is a Z-axis direction (a first direction). Suppose that a single axis perpendicular to a Z-axis (a first axis) is an X-axis (a second axis). Suppose that an axis perpendicular to the Z-axis and the X-axis is a Y-axis (a third axis). In the following, a direction from the p-side electrode 80 toward the n-side electrode 70 is set to an X-axis direction.

The Z-axis is parallel with the axis of stacking the n-type semiconductor layer 10, the light emitting portion 30, and the p-type semiconductor layer 20 in the stacked structure unit 10s.

In the specification, the term "to stack layers" includes the case where layers are laid on each other as contacting with each other as well as the case where another layer is inserted between layers. The term "to be provided on" includes the case where layers are directly provided on each other as well as the case where another layer is inserted between layers.

It is noted that the semiconductor light emitting device 110 may further include a multi-layer structure unit (not shown) provided between the n-type semiconductor layer 10 and the light emitting portion 30. The multi-layer structure unit includes a plurality of first layers (not shown) and a plurality of second layers (not shown) alternately provided along the Z-axis. A GaN layer having a thickness of 3 nm, for example, is used for the first layer. An InGaN layer having a thickness of 1 nm, for example, is used for the second layer. The number of stacked layers of the first layer and the second layer is 30 pairs, for example. The multi-layer structure unit is a superlattice layer, for example.

Figure 2:
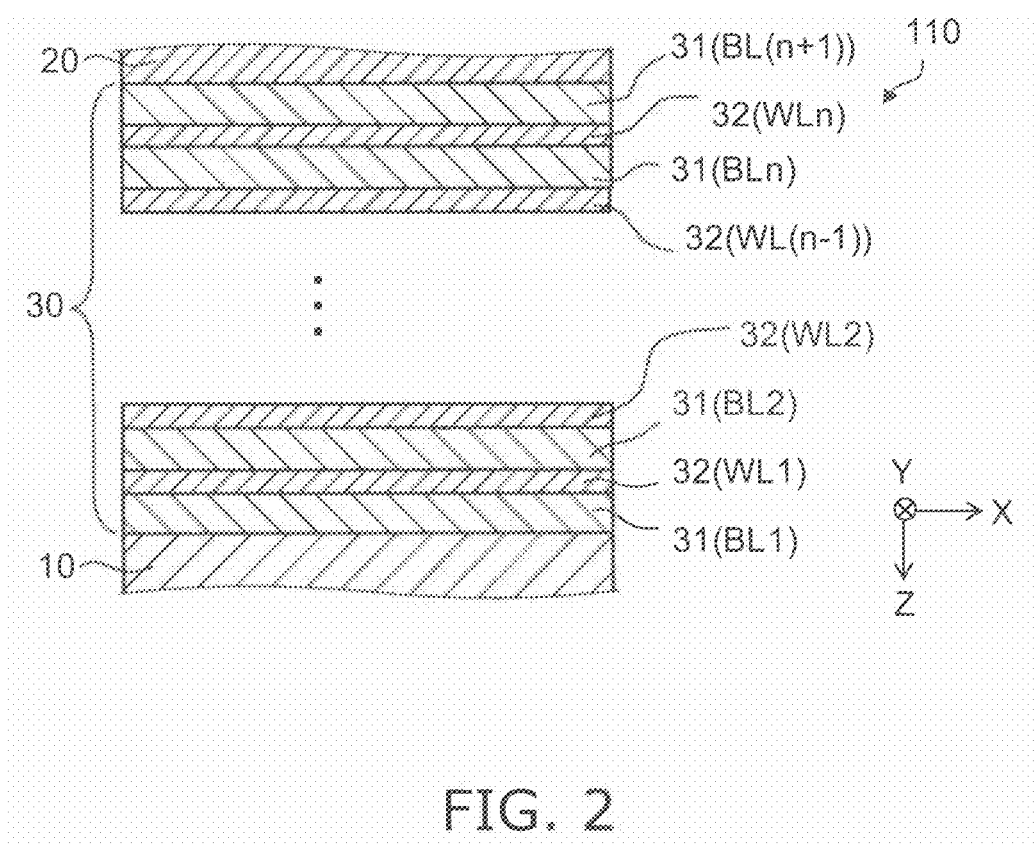
FIG. 2 is a schematic cross-sectional view partially illustrating the configuration of a nitride semiconductor device according to the embodiment.

FIG. 2 is a schematic cross-sectional view partially illustrating the configuration of a nitride semiconductor device according to the embodiment.

As illustrated in FIG. 2, the light emitting portion 30 includes a plurality of barrier layers 31 and a well layer 32 provided between the plurality of barrier layers 31. For example, the plurality of barrier layers 31 and a plurality of well layers 32 are alternately stacked along the Z-axis.

The well layer 32 includes $In_{x1}Ga_{1-x1}N$ (0<x1<1), for example. The barrier layer 31 includes GaN, for example. For example, the well layer 32 includes In, and the barrier layer 31 does not substantially include In. Alternatively, in the case where the barrier layer 31 includes In, the In composition ratio of the barrier layer 31 is lower than the In composition ratio of the well layer 32. The band gap energy of the barrier layer 31 is larger than the band gap energy of the well layer 32.

The light emitting portion 30 can have a single quantum well (SQW) structure. At this time, the light emitting portion 30 includes two barrier layers 31 and a well layer 32 provided between these barrier layers 31. Alternatively, the light emitting portion 30 can have a multi-quantum well (MQW) structure. At this time, the light emitting portion 30 includes three barrier layers 31 or more and a well layer 32 provided between the barrier layers 31.

Namely, the light emitting portion 30 includes (n+1) barrier layers 31 and n well layers 32 (n is an integer of two or more), for example. The (i+1)th barrier layer BL(i+1) is disposed between the ith barrier layer BLi and the p-type semiconductor layer 20 (i is an integer ranging from one to (n−1)). The (i+1)th well layer WL(i+1) is disposed between the ith well layer WLi and the p-type semiconductor layer 20. The first barrier layer BL1 is provided between the n-type semiconductor layer 10 and the first well layer WL1. The nth well layer WLn is provided between the nth barrier layer BLn and the (n+1)th barrier layer BL(n+1). The (n+1)th barrier layer BL(n+1) is provided between the nth well layer WLn and the p-type semiconductor layer 20.

The peak wavelength of light emitted from the light emitting portion 30 ranges from 400 nanometer (nm) to 650 nm, for example. However, in the embodiment, the peak wavelength is optional.

As illustrated in FIG. 1A and FIG. 1B, the transparent electrode 50 has a hole 55. The hole 55 is provided between the n-side electrode 70 and the p-side electrode 80 when seeing a plane along the Z-axis (the first axis from the p-type semiconductor layer 20 toward the n-type semiconductor layer 10). Namely, the transparent electrode 50 has a middle portion MP. The middle portion MP is a portion between the n-side electrode 70 and the p-side electrode 80 when seeing a plane along the Z-axis. The hole 55 is provided in this middle portion MP. The hole 55 penetrates the transparent electrode 50 along the Z-axis.

A width Wh of the hole 55 along the Y-axis (the third axis perpendicular to the second axis from the p-side electrode 80 toward the n-side electrode 70 and perpendicular to the first axis) is longer than a width Wn of the n-side electrode 70 along the Y-axis and a width Wp of the p-side electrode 80 along the Y-axis.

Here, in this example, the plane shape of the hole 55 is a trapezoid. A width Whp of the hole 55 on the p-side electrode 80 side corresponds to the top (a short side) of the trapezoid. A width Whn of the hole 55 on the n-side electrode 70 side corresponds to the base (a long side) of the trapezoid. Namely, the width Whp of the hole 55 on the p-side electrode 80 side is shorter than the width Whn of the hole 55 on the n-side electrode 70 side.

As described above, in the case where the length of the hole 55 along the Y-axis changes along the X-axis, the width Wh of the hole 55 along the Y-axis is the maximum value of the length of the hole 55 along the Y-axis. Namely, in this example, the width Wh of the hole 55 along the Y-axis is the width Whn of the hole 55 on the n-side electrode 70 side (the width along the Y-axis).

In this example, a distance Ln between an end 55en of the hole 55 on the n-side electrode 70 side and the n-side electrode 70 along the X-axis (the second axis) is not longer than a distance Lp between an end 55ep of the hole 55 on the p-side electrode 80 side and the p-side electrode 80 along the X-axis. That is, the distance Ln between the hole 55 and the n-side electrode 70 along the X-axis is not longer than the distance Lp between the hole 55 and the p-side electrode 80 along the X-axis.

Thus, it is possible to improve light extraction efficiency. Therefore, it is possible to obtain a highly efficient semiconductor light emitting device.

In the following, the characteristics of the semiconductor light emitting device 110 according to the embodiment will be explained together with a reference sample.

In a semiconductor light emitting device 191 (not shown) according to a first reference sample, no hole 55 is provided in a middle portion MP of a transparent electrode 50. The configuration other than this is as that of the semiconductor light emitting device 110. For such semiconductor light emitting devices 110 and 191, a current density Jz (A/cm$^2$) carried through the semiconductor light emitting device and a light emitting intensity IL (W/cm$^2$) were found according to simulations.

A semiconductor light emitting device model for the simulations will be explained with reference to FIG. 1A and FIG. 1B.

A length Ldx of the semiconductor light emitting device along the X-axis was 600 μm, and a length Ldy along the Y-axis was 600 μm. A length Lex of the transparent electrode 50 along the X-axis was 550 μm, and a length Ley along the Y-axis was 550 μm. When seen along the Z-axis, the center position of the semiconductor light emitting device is matched with the center position of the transparent electrode 50.

The plane shapes of the p-side electrode 80 and the n-side electrode 70 were a circular shape, and the diameter was 80 μm. Namely, the width Wn of the n-side electrode 70 along the Y-axis and the width Wp of the p-side electrode 80 along the Y-axis are 80 μm. A distance Lpn between the center of the p-side electrode 80 and the center of the n-side electrode 70 was 250 μm.

As illustrated in FIG. 1B, a hole 10h connected to the n-type semiconductor layer 10 is provided on a part of the stacked structure unit 10s, and the n-side electrode 70 is provided on the n-type semiconductor layer 10 in the inside of the hole 10h. The diameter of the hole 10h was 90 μm. Namely, in the inside of the hole 10h, a span Spn between the sidewall of the stacked structure unit 10s and the sidewall of the n-side electrode 70 was 5 μm.

An opening 57 is provided in the transparent electrode 50 along the outer edge of the hole 10h. The diameter (a width Weo) of the opening 57 was 100 μm.

The hole 55 is provided between the n-side electrode 70 and the p-side electrode 80 in the transparent electrode 50. The width Whp of the hole 55 on the p-side electrode 80 side was 40 μm. The width Whn of the hole 55 on the n-side electrode 70 side was 240 μm. Namely, the width Wh of the hole 55 along the Y-axis is 240 μm. In FIG. 1A, the width Whp of the hole 55 is expressed longer than the width Wp of the p-side electrode 80. As described above, the width Whp of the hole 55 may be longer than the width Wp of the p-side electrode 80, or may be shorter than the width Wp of the p-side electrode 80.

A length Lh of the hole 55 along the X-axis was 80 μm. The center position of the hole 55 along the X-axis was set at the midpoint between the center of the n-side electrode 70 and the center of the p-side electrode 80. Namely, the distance Ln between the end 55en of the hole 55 on the n-side electrode 70 side and the n-side electrode 70 along the X-axis was 45 μm. The distance Lp between the end 55ep of the hole 55 on the p-side electrode 80 side and the p-side electrode 80 along the X-axis was 45 μm.

The thickness of the n-type semiconductor layer 10 was 4 µm, the thickness of the light emitting portion 30 was 0.1 µm, and the thickness of the p-type semiconductor layer 20 was 0.1 µm. The thickness of the transparent electrode 50 was 0.4 µm. The thickness of the n-side electrode 70 was 0.3 µm, and the thickness of the p-side electrode 80 was 0.1 µm.

The configuration of the semiconductor light emitting device 191 according to the first reference sample is the same as the configuration of the semiconductor light emitting device 110 except that the hole 55 is not provided.

FIG. 3A to FIG. 3D are schematic views illustrating the characteristics of the semiconductor light emitting devices.

Figure 3A:
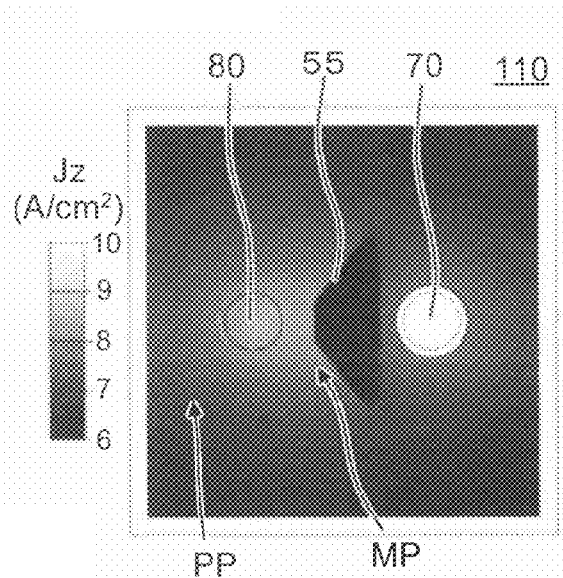
FIG. 3A to FIG. 3D are schematic views illustrating the characteristics of the semiconductor light emitting devices.
Figure 3B:
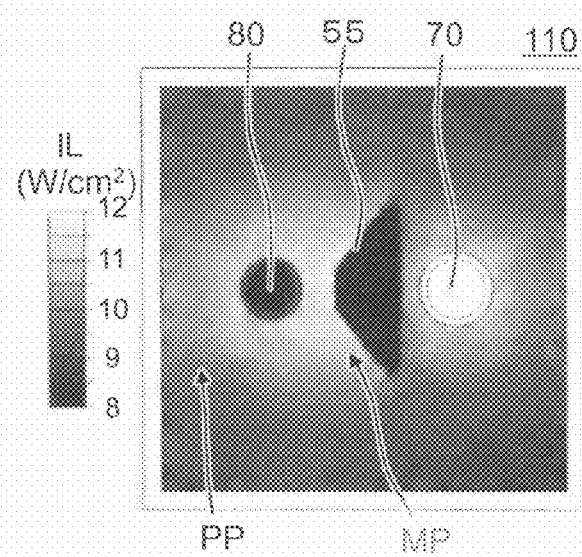
Figure 3C:
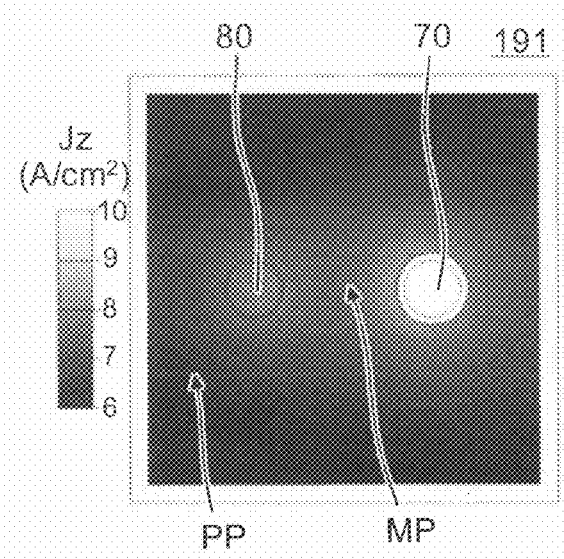
Figure 3D:
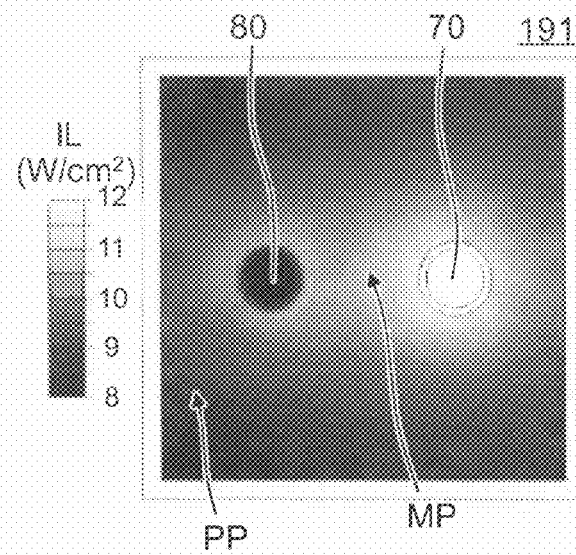

FIG. 3A and FIG. 3B correspond to the semiconductor light emitting device 110 according to the embodiment. FIG. 3C and FIG. 3D correspond to the semiconductor light emitting device 191 according to the first reference sample. FIG. 3A and FIG. 3C show the current distribution (the in-plane distribution of the current density Jz on an X-Y plane). FIG. 3B and FIG. 3D show the light emitting distribution (the in-plane distribution of the light emitting intensity IL on the X-Y plane). In FIG. 3A and FIG. 3C, dark portions in the drawings are portions where the current density Jz is low, and bright portions are portions where the current density Jz is high. In FIG. 3B and FIG. 3D, dark portions in the drawings are portions where the light emitting intensity IL is low, and bright portions are portions where the light emitting intensity IL is high.

As illustrated in FIG. 3C, in the semiconductor light emitting device 191 according to the first reference sample with no hole 55, in the middle portion MP on the line connecting the p-side electrode 80 to the n-side electrode 70, the current density Jz is high. In a peripheral portion PP near the outer edge of the semiconductor light emitting device 191, the current density Jz is considerably low.

Thus, as illustrated in FIG. 3D, in the semiconductor light emitting device 191, the light emitting intensity IL in the middle portion MP is high, and the light emitting intensity IL in the peripheral portion PP is low.

On the other hand, as illustrated in FIG. 3A, in the semiconductor light emitting device 110 according to the embodiment, the hole 55 is provided in the middle portion MP, and the current density Jz of the middle portion MP is low. The hole 55 suppresses a current carried through the middle portion MP. The current density Jz is increased in the peripheral portion PP. This is because a current supplied to the middle portion MP is carried through the peripheral portion PP.

Thus, as illustrated in FIG. 3B, in the semiconductor light emitting device 110, the light emitting intensity IL in the middle portion MP is made lower, and the light emitting intensity IL in the peripheral portion PP is more increased than in the semiconductor light emitting device 191.

Namely, as compared with the semiconductor light emitting device 191 according to the first reference sample, in the semiconductor light emitting device 110 according to the embodiment, the current in the peripheral portion PP is increased, and the light emitting intensity IL in the peripheral portion PP is increased.

Thus, it is possible to improve light extraction efficiency.

Figure 4A:
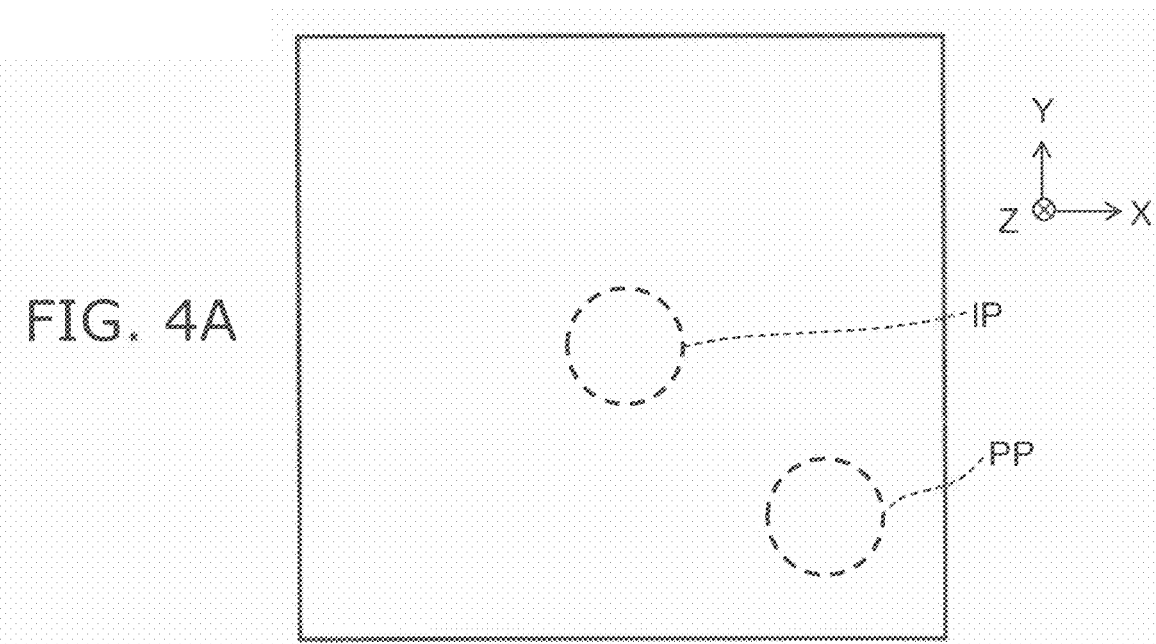
FIG. 4A to FIG. 4C are schematic views illustrating the characteristics of the semiconductor light emitting device.
Figure 4B:
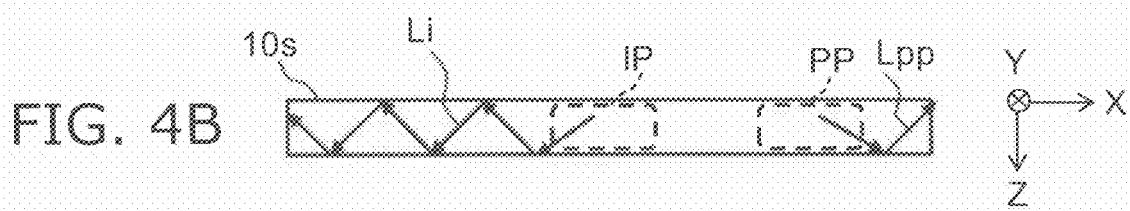
Figure 4C:
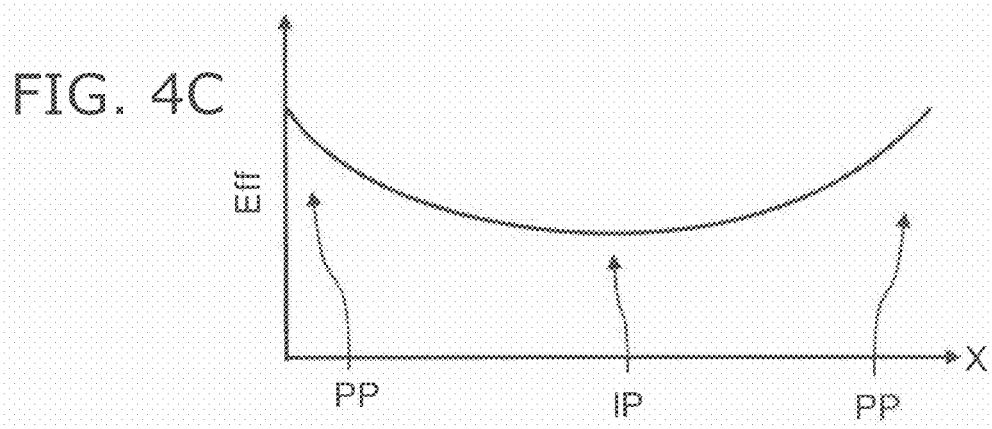

FIG. 4A to FIG. 4C are schematic views illustrating the characteristics of the semiconductor light emitting device.

FIG. 4A is a schematic plan view, and FIG. 4B is a schematic cross-sectional view. FIG. 4C is a graph schematically illustrating the relationship between the position and light extraction efficiency of the semiconductor light emitting device. The horizontal axis expresses the position along the X-axis, and the perpendicular axis expresses a light extraction efficiency Eff.

As illustrated in FIG. 4A, when seen along the Z-axis, a portion apart from the outer edge of the semiconductor light emitting device is an inner side portion IP. A portion close to the outer edge of the semiconductor light emitting device is the peripheral portion PP.

As illustrated in FIG. 4B, in the semiconductor light emitting device, a part of light emitted from the light emitting portion 30 propagates the inside of the stacked structure unit 10s, and goes out from the side face of the stacked structure unit 10s. At this time, a distance through which a light Lpp emitted at the peripheral portion PP propagates until the light Lpp goes out from the side face is short, and the number of times of reflection is small. On the contrary, a distance through which a light Lip emitted at the inner side portion IP propagates until the light Lip goes out from the side face is long, and the number of times of reflection is large. Thus, the damping of the light Lip emitted at the inner side portion IP until the light Lip goes out from the side face is large.

Thus, as illustrated in FIG. 4C, the light extraction efficiency Eff in the peripheral portion PP is higher than the light extraction efficiency in the inner side portion IP.

If the light emitted at the inner side portion IP can be suppressed and the light emitted at the peripheral portion PP can be increased, it is possible to enhance the light extraction efficiency of the light going out from the side face of the semiconductor light emitting device and to improve overall light extraction efficiency, for example.

In order to suppress the light emitted at the inner side portion IP and increase the light emitted at the peripheral portion PP, in the embodiment, the hole 55 is provided in the transparent electrode 50 in the middle portion MP (namely, the inner side portion IP) between the p-side electrode 80 and the n-side electrode 70.

Figure 5A:
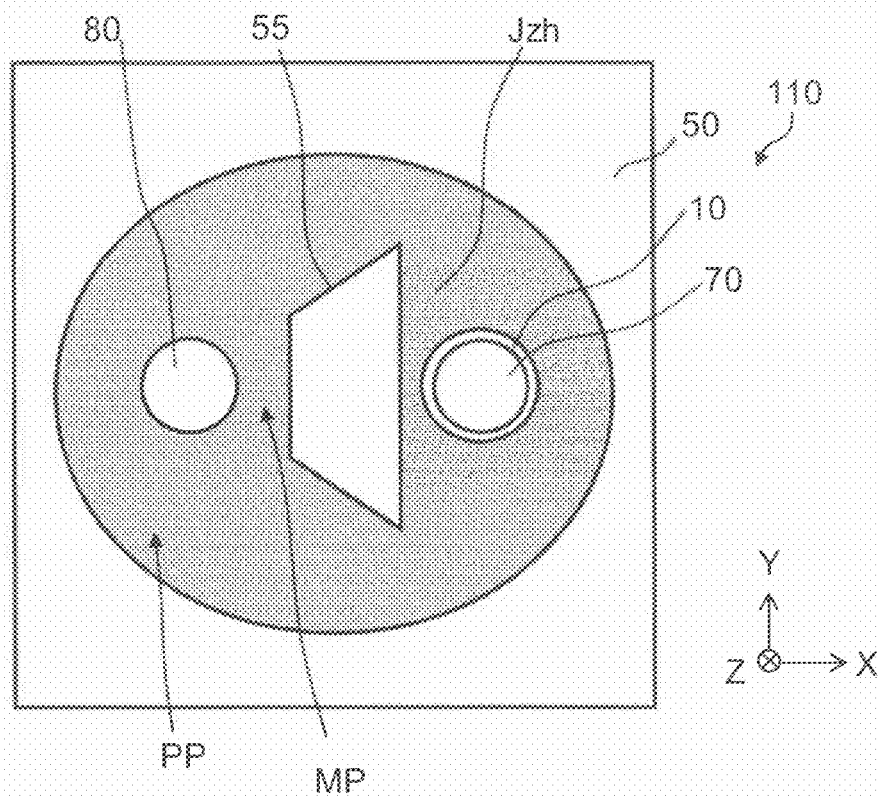
FIG. 5A and FIG. 5B are schematic views illustrating the characteristics of the semiconductor light emitting devices.
Figure 5B:
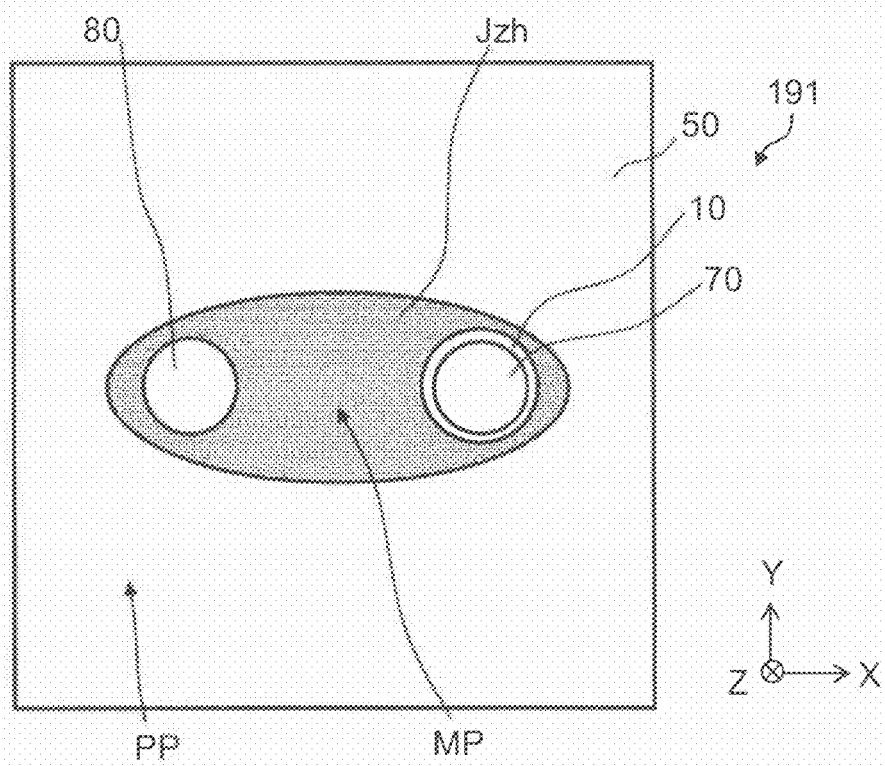

FIG. 5A and FIG. 5B are schematic views illustrating the characteristics of the semiconductor light emitting devices.

FIG. 5A illustrates the characteristics of the semiconductor light emitting device 110 according to the embodiment. FIG. 5B illustrates the characteristics of the semiconductor light emitting device 191 according to the first reference sample. These drawings schematically show the distribution of the current density Jz in the semiconductor light emitting devices. A hatched region Jzh in the drawings corresponds to a region where the current density Jz is high.

As illustrated in FIG. 5B, in the semiconductor light emitting device 191 according to the first reference sample with no hole 55 provided in the transparent electrode 50, the current density Jz is high in the middle portion MP (namely, the inner side portion IP) between the p-side electrode 80 and the n-side electrode 70. However, the current density Jz is low in the peripheral portion PP.

As illustrated in FIG. 5A, in the semiconductor light emitting device 110 according to the embodiment, since the hole 55 is provided in the transparent electrode 50 in the middle portion MP between the p-side electrode 80 and the n-side electrode 70, a current is difficult to be carried through the middle portion MP, and the current density Jz of the middle portion MP is suppressed. A current that is not carried through the middle portion MP is bypassed to the peripheral portion PP. Thus, it is possible to increase the current density Jz in the peripheral portion PP.

As described above, in the embodiment, since the hole 55 is provided in the transparent electrode 50 in the middle portion MP between the p-side electrode 80 and the n-side electrode 70, a current carried through the middle portion MP is suppressed, and the current is bypassed to the peripheral portion PP. Thus, the light emitted at the middle portion MP (the inner side portion IP) is suppressed, and the light emitted at the peripheral portion PP is increased. Therefore, it is possible to obtain a high light extraction efficiency.

Figure 6:
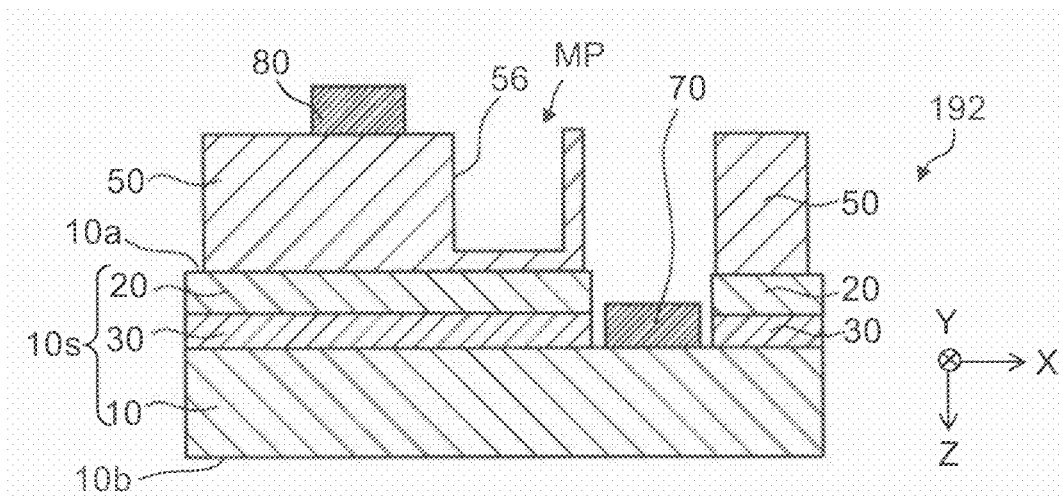
FIG. 6 is a schematic view illustrating the configuration of the semiconductor light emitting device according to a second reference sample.

FIG. 6 is a schematic view illustrating the configuration of the semiconductor light emitting device according to a second reference sample.

As illustrated in FIG. 6, in a semiconductor light emitting device 192 according to the second reference sample, in the middle portion MP between a p-side electrode 80 and an n-side electrode 70, a recess 56 is provided in a transparent electrode 50. The recess 56 dose not penetrate the transparent electrode 50 along the Z-axis direction. The plane shape of the recess 56 (the shape when seen along the Z-axis) is the same as the plane shape of the hole 55 in the semiconductor light emitting device 110, for example.

Namely, in the semiconductor light emitting device 192, a thick portion and a thin portion (the recess 56) are provided on the transparent electrode 50. The electric resistance of the recess 56 (the thin portion) is higher than the electric resistance of the other portion (the thick portion). It is possible to suppress a current carried through the middle portion MP also in the semiconductor light emitting device 192 depending on the configuration of the recess 56. Thus, there is a possibility that the amount of light emitted at the peripheral portion PP is increased. However, in order to form such a thick portion and a thin portion (the recess 56) in the transparent electrode 50, two-stage processing, for example, is necessary, causing a low productivity. In order to highly accurately control the thickness of the recess 56, a high degree of process control is necessary.

On the contrary, in the embodiment, the hole 55 provided in the transparent electrode 50 is formed so as to penetrate the transparent electrode 50 in the thickness direction. Thus, complicated processing is unnecessary, and productivity is high. The hole 55 can be formed with no use of a high degree of process control.

In the embodiment, the hole 55 provided in the transparent electrode 50 suppresses a current carried between the p-side electrode 80 and the n-side electrode 70 along a straight line (a straight line along the X-axis) connecting the p-side electrode 80 to the n-side electrode 70. Thus, the width of the hole 55 (the width Wh of the hole 55 along the Y-axis) is set longer than the width Wn of the n-side electrode 70 along the Y-axis and the width Wp of the p-side electrode 80 along the Y-axis. When the width Wh of the hole 55 is the width Wn and the width Wp or less, a current carried between the p-side electrode 80 and the n-side electrode 70 along the straight line connecting the p-side electrode 80 to the n-side electrode 70 cannot be sufficiently suppressed. The width Wh of the hole 55 is made longer than the width Wn and the width Wp, so that it is possible to effectively block a current carried between the p-side electrode 80 and the n-side electrode 70 along the straight line connecting the p-side electrode 80 to the n-side electrode 70, and it is possible to effectively bypass the current to the peripheral portion PP.

In the semiconductor light emitting device 191 according to the first reference sample, light is emitted intensively at the inner side portion IP on the straight line connecting the p-side electrode 80 to the n-side electrode 70, whereas in the semiconductor light emitting device 110, light emission is promoted at the peripheral portion PP with high light extraction efficiency.

It is also possible to consider a configuration (a third reference sample) in which a plurality of holes with a small diameter penetrating the transparent electrode 50 are provided in a specific region in the middle portion MP between the p-side electrode 80 and the n-side electrode 70. In the configuration, there is a possibility that a current carried between the p-side electrode 80 and the n-side electrode 70 along the straight line connecting the p-side electrode 80 to the n-side electrode 70 is reduced depending on the disposition of the plurality of holes. There is a possibility that the current is effectively bypassed to the peripheral portion PP by appropriately designing the disposition of the plurality of holes. However, the uniform manufacture of the plurality of holes with a small diameter with excellent reproducibility leads to a large burden of manufacturing processes. In the configuration using the plurality of holes with a small diameter, it is difficult to obtain uniform characteristics with excellent reproducibility. For example, the production yields of the third reference sample are low.

On the contrary, in the semiconductor light emitting device 110 according to the embodiment, the width Wh of the hole 55 provided in the transparent electrode 50 is longer than the width Wn of the n-side electrode 70 and the width Wp of the p-side electrode 80. Namely, a sufficiently large hole 55, which can be readily formed, is formed in the transparent electrode 50. Thus, in the semiconductor light emitting device 110, it is possible to obtain uniform characteristics with excellent reproducibility. Namely, it is possible to obtain a high production yield.

Figure 7:
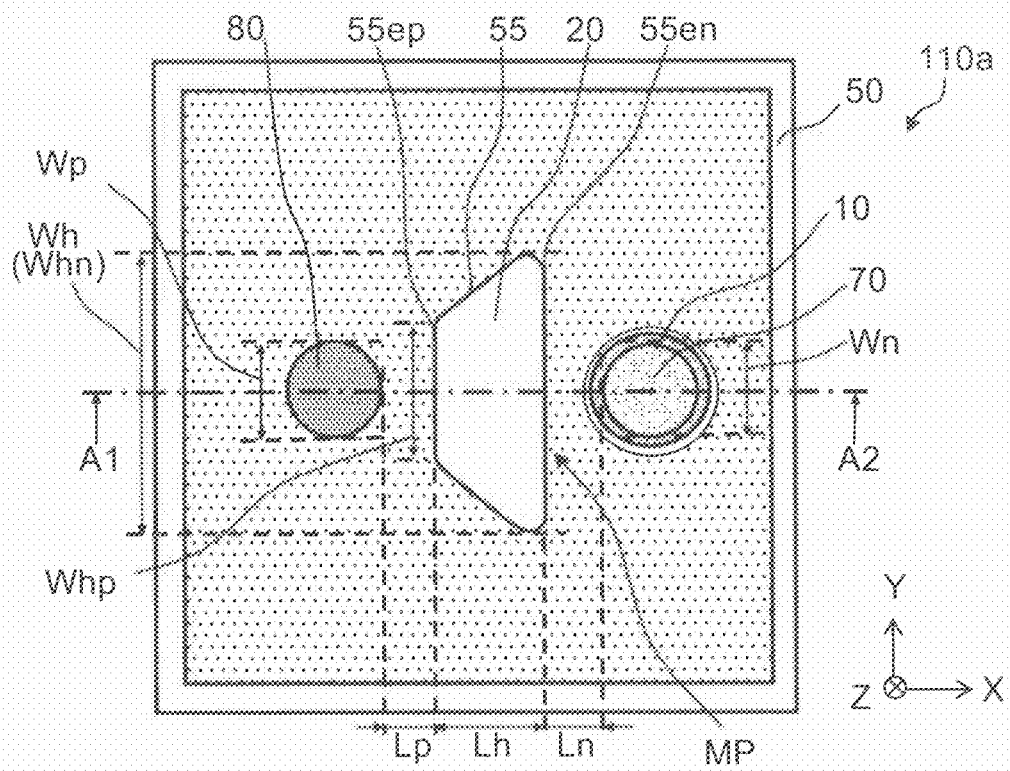
FIG. 7 is a schematic plan view illustrating the configuration of another semiconductor light emitting device according to the embodiment.

FIG. 7 is a schematic plan view illustrating the configuration of another semiconductor light emitting device according to the embodiment.

As illustrated in FIG. 7, in a semiconductor light emitting device 110a according to the embodiment, the plane shape of a hole 55 (the shape when seen along the Z-axis) provided in a transparent electrode 50 is different from that in the semiconductor light emitting device 110. Other configurations are the same as those of the semiconductor light emitting device 110.

As illustrated in FIG. 7, in the semiconductor light emitting device 110a, the plane shape of the hole 55 is a trapezoid with round corners.

In the case where the plane shape of the hole 55 is a polygon with round corners, the width (the length of an end 55en along the Y-axis) at the end 55en of the hole 55 on an n-side electrode 70 side is shorter than a width Wh of the hole 55 along the Y-axis (the maximum value of the length of the hole 55 along the Y-axis). The width (the length of an end 55ep along the Y-axis) at the end 55ep of the hole 55 on a p-side electrode 80 side is shorter than the width Wh of the hole 55 along the Y-axis.

As described above, in the case where the plane shape of the hole 55 is a polygon with round corners, the width Whn of the hole 55 on the n-side electrode 70 side can be expediently determined as the maximum value of the length of the hole 55 along the Y-axis in the range in which the distance from the end 55en is between the end 55en and the position 10% of the length Lh of the hole 55 along the X-axis.

In the case where the plane shape of the hole 55 is a polygon with round corners, the width Whp of the hole 55 on the p-side electrode 80 side can be expediently determined as the maximum value of the length of the hole 55 along the Y-axis in the range in which the distance from the end 55ep is between the end 55ep and the position 10% of the length Lh.

Also in the semiconductor light emitting device 110a, the width Wh of the hole 55 is longer than the width Wn of the n-side electrode 70 and the width Wp of the p-side electrode 80. The plane shape of the hole 55 is a trapezoid with round corners, and the width Whp of the hole 55 on the p-side electrode 80 side is shorter than the width Whn of the hole 55 on the n-side electrode 70 side. The distance Ln is the distance Lp or less. With this configuration, it is possible to provide a highly efficient semiconductor light emitting device.

As described above, also in the case where round corners are provided on the plane shape of a polygon of the hole 55, it is possible to obtain the effect of suppressing a current carried through the middle portion MP described above. Thus, the term "polygon" also includes a polygon provided with round corners.

In the following, the results of investigating the characteristics of semiconductor light emitting devices according to the embodiment will be explained. In the following, the results of investigating the dimensions of the hole 55 will be described.

FIG. 8A to FIG. 8C are schematic plan views illustrating the configurations of semiconductor light emitting devices.

As illustrated in FIG. 8A to FIG. 8C, also in semiconductor light emitting devices 151 to 153, a hole 55 penetrating a transparent electrode 50 along the Z-axis direction is provided in the transparent electrode 50. In these examples, the shape of the hole 55 is a rectangle. The configurations other than the hole 55 are the same as the configurations of the semiconductor light emitting device 110 explained with reference to FIG. 1A and FIG. 1B.

As illustrated in FIG. 8A, in the semiconductor light emitting device 151, the width Wh of the hole 55 along the Y-axis was 150 μm, and the length Lh of the hole 55 along the X-axis was 100 μm. The center position of the hole 55 along the X-axis was set to the midpoint between the center of the n-side electrode 70 and the center of the p-side electrode 80. Namely, the distance Ln between the end 55en of the hole 55 on the n-side electrode 70 side and the n-side electrode 70 along the X-axis was 35 μm. The distance Lp between the end 55ep of the hole 55 on the p-side electrode 80 side and the p-side electrode 80 along the X-axis was 35 μm.

As illustrated in FIG. 8B, in the semiconductor light emitting device 152, the width Wh of the hole 55 along the Y-axis was 100 μm, and the length Lh of the hole 55 along the X-axis was 150 μm. The center position of the hole 55 along the X-axis was set to the midpoint between the center of the n-side electrode 70 and the center of the p-side electrode 80. Namely, the distance Ln is 10 μm, and the distance Lp is 10 μm.

As illustrated in FIG. 8C, in the semiconductor light emitting device 153, the width Wh of the hole 55 along the Y-axis was 50 μm, and the length Lh of the hole 55 along the X-axis was 100 μm. The center position of the hole 55 along the X-axis was set to the midpoint between the center of the n-side electrode 70 and the center of the p-side electrode 80. Namely, the distance Ln is 35 μm, and the distance Lp is 35 μm.

In the semiconductor light emitting devices 151 and 152, the width Wh of the hole 55 along the Y-axis is longer than the width Wn of the n-side electrode 70 along the Y-axis (80 μm) and the width Wp of the p-side electrode 80 along the Y-axis (80 μm). The semiconductor light emitting devices 151 and 152 are included in an embodiment.

In the semiconductor light emitting device 153, the width Wh of the hole 55 along the Y-axis is shorter than the width Wn of the n-side electrode 70 along the Y-axis and the width Wp of the p-side electrode 80 along the Y-axis. The semiconductor light emitting device 153 corresponds to the reference samples.

The in-plane distribution of the light emitting intensity IL of such a semiconductor light emitting device was found according to simulations. The mean value of the light emitting intensity IL and the standard deviation of the light emitting intensity IL in a plane were found from the values of the light emitting intensity IL at in-plane positions explained below.

FIG. 9 is a schematic plan view illustrating evaluation positions of the characteristics of the semiconductor light emitting device.

As illustrated in FIG. 9, in the inside of the light emitting surface of the semiconductor light emitting device, four evaluation positions P1 to P4 were set. The hole 55 is disposed between the evaluation positions P1 and P2. The n-side electrode 70, the hole 55, and the p-side electrode 80 are disposed between the evaluation positions P3 and P4.

The positions of the evaluation position P1 and P2 along the X-axis correspond to the position of the midpoint between the center of the n-side electrode 70 and the center of the p-side electrode 80 along the X-axis. A distance between a line passing through the center of the n-side electrode 70 and the center of the p-side electrode 80 and the evaluation position P1 is a distance Lq. A distance between the line passing through the center of the n-side electrode 70 and the center of the p-side electrode 80 and the evaluation position P2 is also the distance Lq. The positions of the evaluation positions P3 and P4 along the Y-axis are on the line passing through the center of the n-side electrode 70 and the center of the p-side electrode 80. A distance between the midpoint between the center of the n-side electrode 70 and the center of the p-side electrode 80 and the evaluation position P3 is the distance Lq. The distance between the midpoint between the center of the n-side electrode 70 and the center of the p-side electrode 80 and the evaluation position P4 is also the distance Lq. In this evaluation, the distance Lq was 200 μm.

The mean value and standard deviation of the light emitting intensity IL were found from the results of the found in-plane distribution of the light emitting intensity IL, as for the four evaluation positions P1 to P4.

Figure 10:
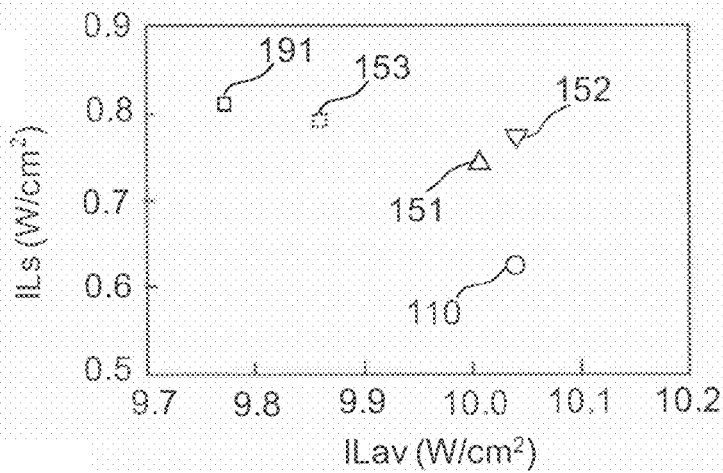
FIG. 10 is a graph illustrating the characteristics of the semiconductor light emitting devices.

FIG. 10 is a graph illustrating the characteristics of the semiconductor light emitting devices.

This drawing shows the characteristics of the semiconductor light emitting devices 110 and 191 already explained, in addition to the semiconductor light emitting devices 151 to 153. The horizontal axis in FIG. 10 expresses the mean value of the light emitting intensity IL (an average light emitting intensity ILav), and the vertical axis expresses a standard deviation ILs of the light emitting intensity IL. In FIG. 10, desirably, the average light emitting intensity ILav is high, and the standard deviation ILs is small.

As illustrated in FIG. 10, in the semiconductor light emitting device 191 according to the first reference sample, the average light emitting intensity ILaV is low, and the standard deviation ILs is high. On the contrary, in the semiconductor light emitting device 110, the average light emitting intensity ILav is high, and the standard deviation ILs is considerably small. This is because of the effect explained as for FIG. 3A to FIG. 3D, FIG. 4A to FIG. 4C, and FIG. 5A and FIG. 5B.

In the semiconductor light emitting device 153, the average light emitting intensity ILav is still small, and the standard deviation ILs is still large, although the average light emitting intensity ILav and the standard deviation ILs are improved more than those of the semiconductor light emitting device 191.

On the contrary, in the semiconductor light emitting devices 151 and 152, the average light emitting intensity ILav is high, and the standard deviation ILs is reduced.

As described above, the width Wh of the hole 55 along the Y-axis is made longer than the width Wn of the n-side electrode 70 along the Y-axis and the width Wp of the p-side electrode 80 along the Y-axis, so that it is possible to enhance the average light emitting intensity ILav and to reduce the standard deviation ILs. In the embodiment, the width Wh of the hole 55 is made longer than the width Wn of the n-side electrode 70 and the width Wp of the p-side electrode 80, so that it is possible to improve efficiency.

Next, the results of investigating the position of the hole 55 provided in the transparent electrode 50 along the X-axis will be described.

Figures 11A, 11B:
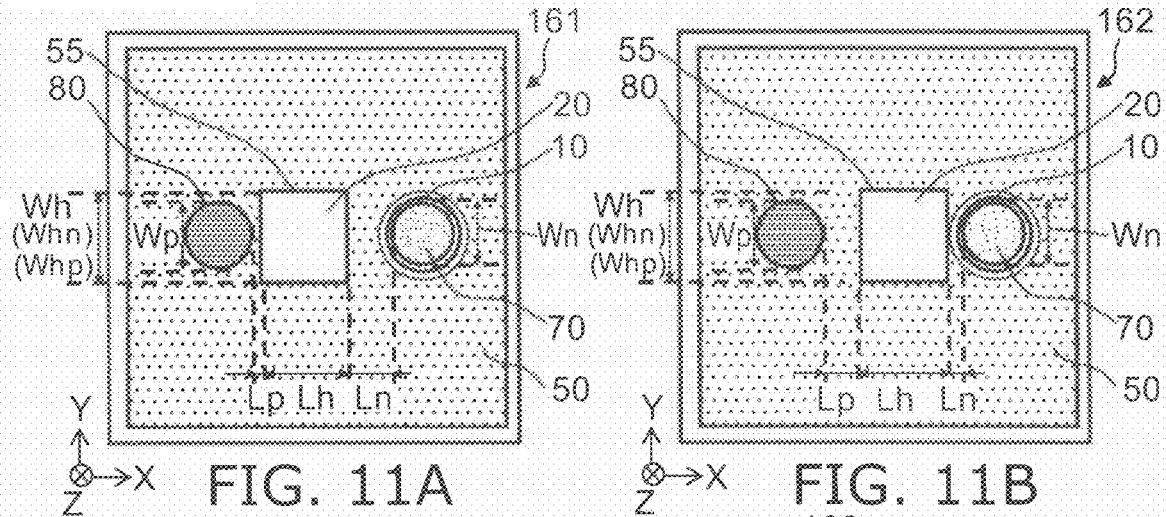
FIG. 11A to FIG. 11C are schematic plan views illustrating the configuration of semiconductor light emitting devices.
Figure 11C:
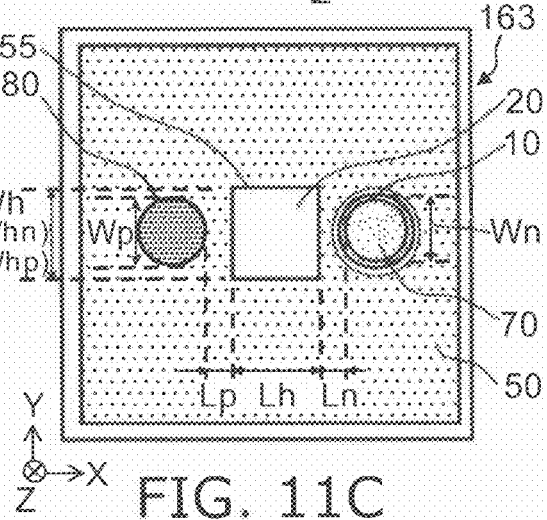

FIG. 11A to FIG. 11C are schematic plan views illustrating the configuration of semiconductor light emitting devices.

As illustrated in FIG. 11A to FIG. 11C, also in semiconductor light emitting devices 161 to 163, a hole 55 penetrating a transparent electrode 50 along the Z-axis direction is provided in the transparent electrode 50. In these examples, the shape of the hole 55 is a square. The width Wh of the hole 55 along the Y-axis was 100 μm, and the length Lh of the hole 55 along the X-axis was 100 μm.

The position of the hole 55 was changed along the X-axis.

In the semiconductor light emitting device 161, the hole 55 is located close to the p-side electrode 80. In the semiconductor light emitting device 162, the hole 55 is located close to the n-side electrode 70. In the semiconductor light emitting device 163, the hole 55 is provided at the center.

Namely, in the semiconductor light emitting device 161, the distance Ln between the end 55en of the hole 55 on the n-side electrode 70 side and the n-side electrode 70 along the X-axis was 55 μm. The distance Lp between the end 55ep of the hole 55 on the p-side electrode 80 side and the p-side electrode 80 along the X-axis was 15 μm.

In the semiconductor light emitting device 162, the distance Ln was 15 μm, and the distance Lp was 55 μm.

In the semiconductor light emitting device 163, the center position of the hole 55 along the X-axis was set to the midpoint between the center of the n-side electrode 70 and the center of the p-side electrode 80. Namely, the distance Ln was 35 μm, and the distance Lp was 35 μm.

Figure 12:
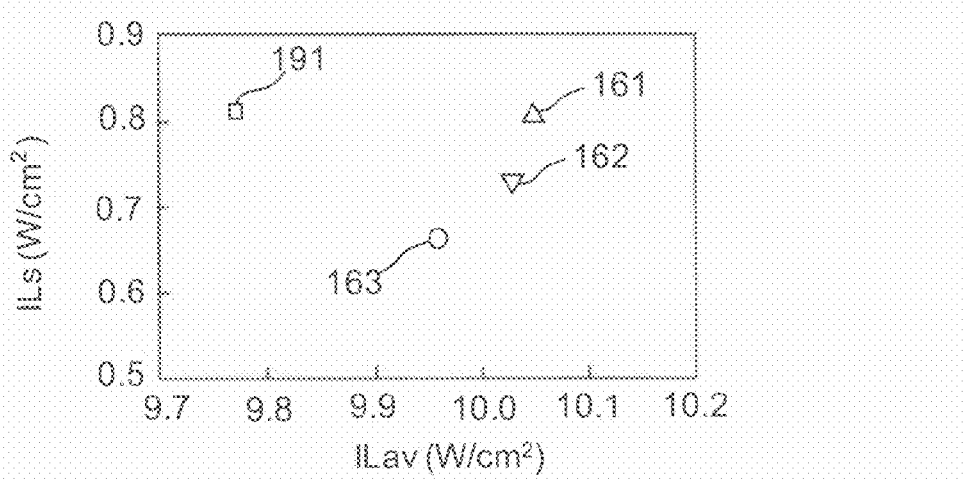
FIG. 12 is a graph illustrating the characteristics of the semiconductor light emitting devices.
Figures 13A, 13B, 13C, 13D:
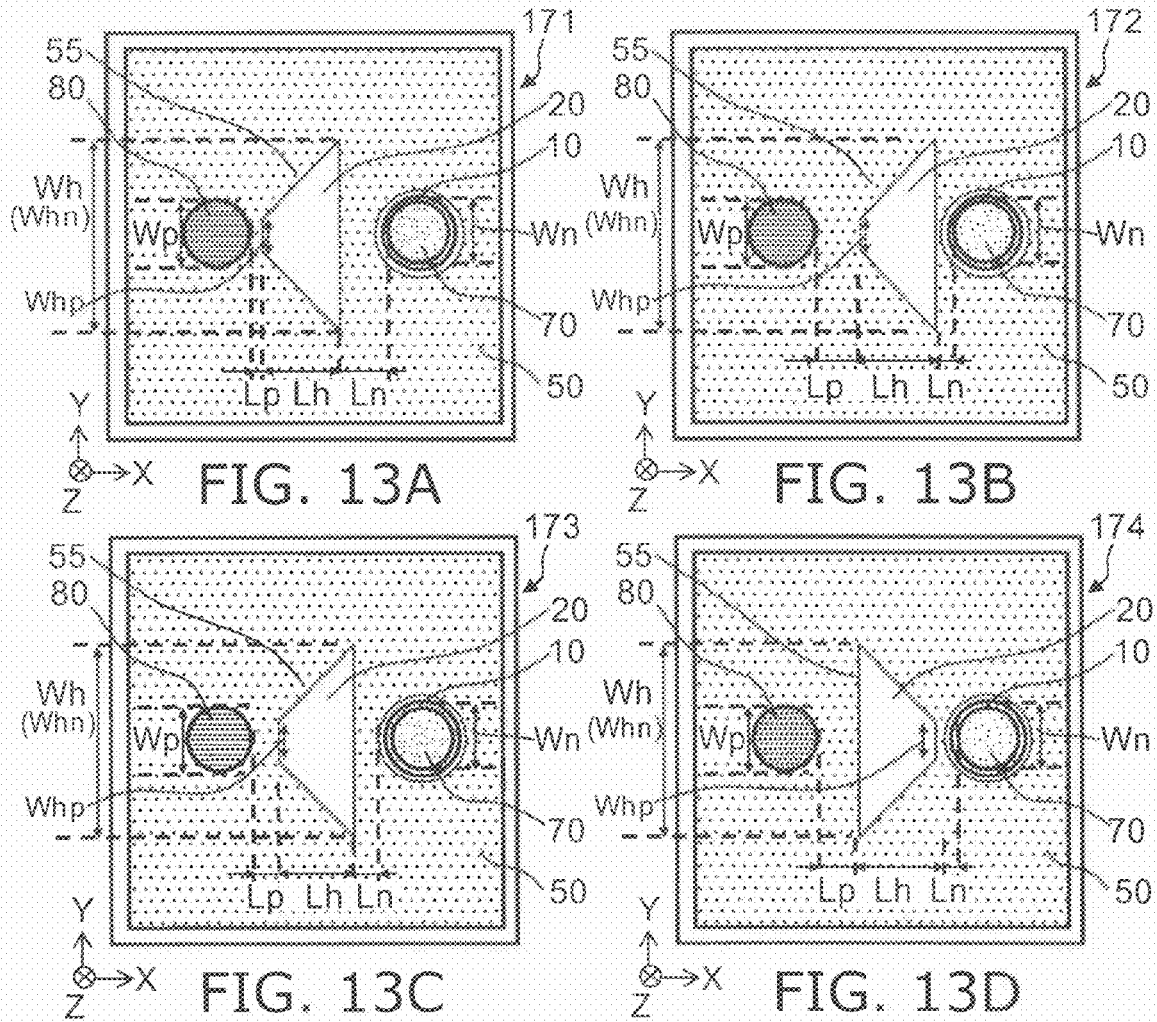
FIG. 13A to FIG. 13D are schematic plan views illustrating the configuration of semiconductor light emitting devices.

FIG. 12 is a graph illustrating the characteristics of the semiconductor light emitting devices.

FIG. 12 also shows the characteristics of the semiconductor light emitting device 191, in addition to the semiconductor light emitting devices 161 to 163.

As illustrated in FIG. 12, in any of the semiconductor light emitting devices 161 to 163, a higher average light emitting intensity ILav can be obtained than in the semiconductor light emitting device 191.

In the semiconductor light emitting device 161 having the hole 55 close to the p-side electrode 80, although the average light emitting intensity ILaV is considerably high, the standard deviation ILs is almost the same as that of the semiconductor light emitting device 191.

In the semiconductor light emitting device 163 having the center of the hole 55 located at the midpoint between the n-side electrode 70 and the p-side electrode 80, the standard deviation ILs is considerably small.

On the other hand, in the semiconductor light emitting device 162 having the hole 55 close to the n-side electrode 70, a high average light emitting intensity ILav and a small standard deviation ILs can be obtained. In order to obtain a high average light emitting intensity ILav and a small standard deviation ILs at the same time, it can be considered that it is effective to bring the hole 55 closer to the n-side electrode 70 than the p-side electrode 80.

FIG. 13A to FIG. 13D are schematic plan views illustrating the configuration of semiconductor light emitting devices.

As illustrated in FIG. 13A to FIG. 13D, also in semiconductor light emitting devices 171 to 174, a hole 55 penetrating a transparent electrode 50 along the Z-axis direction is provided in the transparent electrode 50. In these examples, the shape of the hole 55 is a trapezoid. In the semiconductor light emitting devices 171 to 173, the width Whn of the hole 55 on the n-side electrode 70 side is 240 μm. The width Whp of the hole 55 on the p-side electrode 80 side is 40 μm. The length Lh of the hole 55 along the X-axis is 80 μm.

In the semiconductor light emitting devices 171 to 173, the position of the hole 55 was changed along the X-axis.

In the semiconductor light emitting device 171, the hole 55 is located close to the p-side electrode 80. In the semiconductor light emitting device 172, the hole 55 is located close to the n-side electrode 70. In the semiconductor light emitting device 173, the hole 55 is provided at the center.

Namely, in the semiconductor light emitting device 171, the distance Ln was 65 μm, and the distance Lp was 25 μm.

In the semiconductor light emitting device 172, the distance Ln was 25 μm, and the distance Lp was 65 μm.

In the semiconductor light emitting device 173, the distance Ln was 45 μm, and the distance Lp was 45 μm. The semiconductor light emitting device 173 is the same as the semiconductor light emitting device 110.

In the semiconductor light emitting device 174, the hole 55 of the semiconductor light emitting device 172 is inverted with respect to the Y-axis. Namely, in the semiconductor light emitting device 174, the width Whn of the hole 55 on the n-side electrode 70 side is 40 μm. The width Whp of the hole 55 on the p-side electrode 80 side is 240 μm. The length Lh of the hole 55 along the X-axis is 80 μm. The distance Ln is 25 μm, and the distance Lp is 65 μm.

Figure 14:
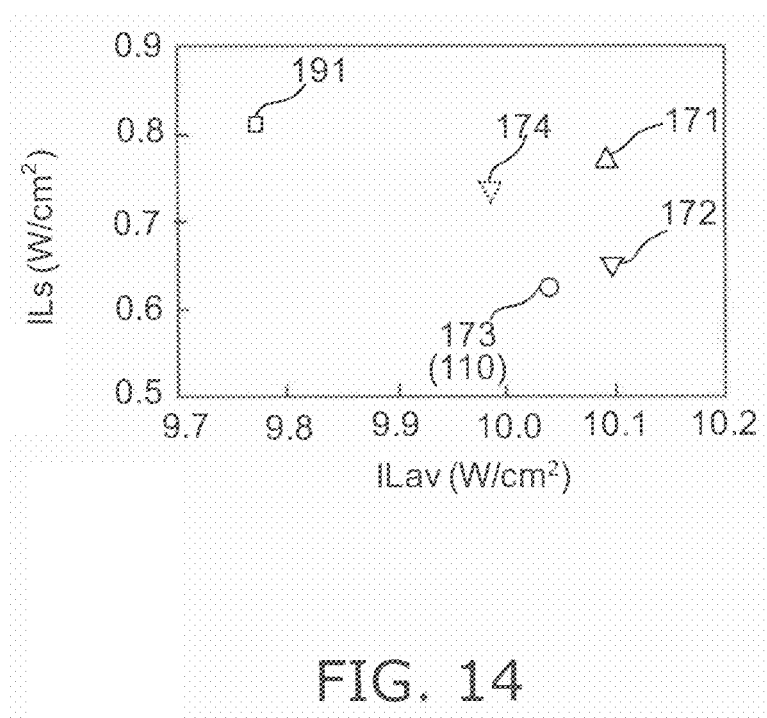
FIG. 14 is a graph illustrating the characteristics of the semiconductor light emitting devices.

FIG. 14 is a graph illustrating the characteristics of the semiconductor light emitting devices.

As illustrated in FIG. 14, also in any of the semiconductor light emitting devices 171 to 174, a higher average light emitting intensity ILav can be obtained than in the semiconductor light emitting device 191.

In the semiconductor light emitting device 171 having the hole 55 close to the p-side electrode 80, the average light emitting intensity ILaV is considerably high. When the semiconductor light emitting device 171 is compared with the semiconductor light emitting device 161 illustrated in FIG. 12, the standard deviation ILs is improved.

As described above, preferably, the shape of the hole 55 is a trapezoid, not a rectangle, in which the end 55en on the n-side electrode 70 side is longer than the end 55ep on the p-side electrode 80 side.

In the semiconductor light emitting device 173 (the semiconductor light emitting device 110) having the center of the hole 55 located at the midpoint between the n-side electrode 70 and the p-side electrode 80, the standard deviation ILs is considerably small.

On the other hand, in the semiconductor light emitting device 173 having the hole 55 close to the n-side electrode 70, a high average light emitting intensity ILav and a small standard deviation ILs can be obtained.

As described above, the hole 55 is located closer to the n-side electrode 70 than the p-side electrode 80, so that it is possible to obtain a high average light emitting intensity ILav and a small standard deviation ILs at the same time.

Desirably, the distance Ln between the end 55en of the hole 55 on the n-side electrode 70 side and the n-side electrode 70 along the X-axis is the distance Lp between the end 55ep of the hole 55 on the p-side electrode 80 side and the p-side electrode 80 along the X-axis or less. Thus, it is possible to effectively suppress a current carried through the middle portion MP between the p-side electrode 80 and the n-side electrode 70, and it is possible to effectively enhance the current density Jz of the peripheral portion PP.

Also in the semiconductor light emitting device 174, the average light emitting intensity ILaV is high, and the standard deviation ILs is small, as compared with the semiconductor light emitting device 191 according to the first reference sample. As described above, the characteristics are improved when the hole 55 is brought close to the n-side electrode 70. However, when comparing the semiconductor light emitting device 174 with the semiconductor light emitting device 172, the semiconductor light emitting device 174 is more excellent in both of the average light emitting intensity ILaV and the standard deviation ILs. As described above, more preferably, the shape of the hole 55 is a trapezoid in which the end 55en on the n-side electrode 70 side is longer than the end 55ep on the p-side electrode 80 side, not a trapezoid in which the end 55en on the n-side electrode 70 side is shorter than the end 55ep on the p-side electrode 80 side.

As described above, it is possible to obtain much higher characteristics according to at least one of an asymmetric disposition of the hole 55 (the hole 55 is brought close to the n-side electrode 70) and an asymmetric shape of the hole 55 (the width on the n-side electrode 70 side is wide). It can be considered that this is related to the difference between the electron injection characteristics and hole injection characteristics of the light emitting portion 30, for example.

The distance Ln is set shorter than the distance Lp while the width Whn is set longer than the width Whp, so that it is possible to more effectively enhance the current density Jz of the peripheral portion PP.

Figure 15A:
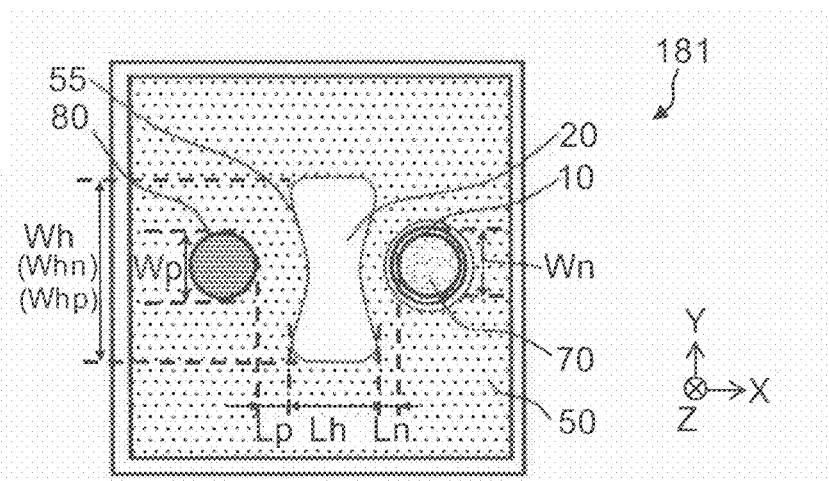
FIG. 15A to FIG. 15C are schematic plan views illustrating the configuration of another semiconductor light emitting devices according to the embodiment.
Figure 15B:
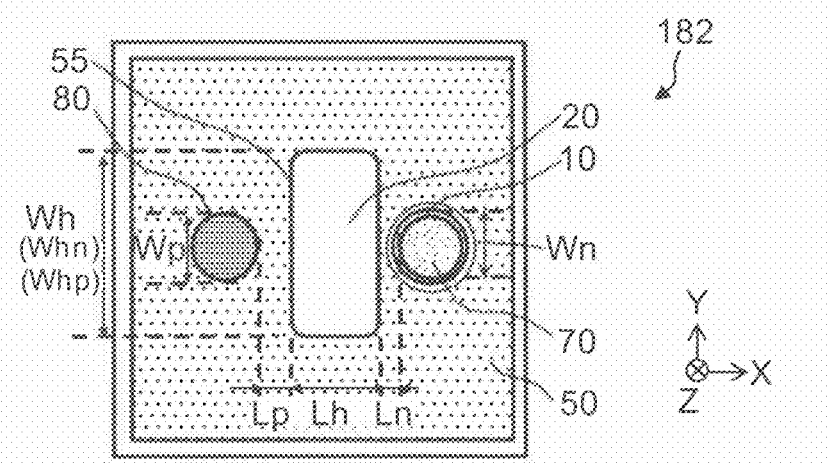
Figure 15C:
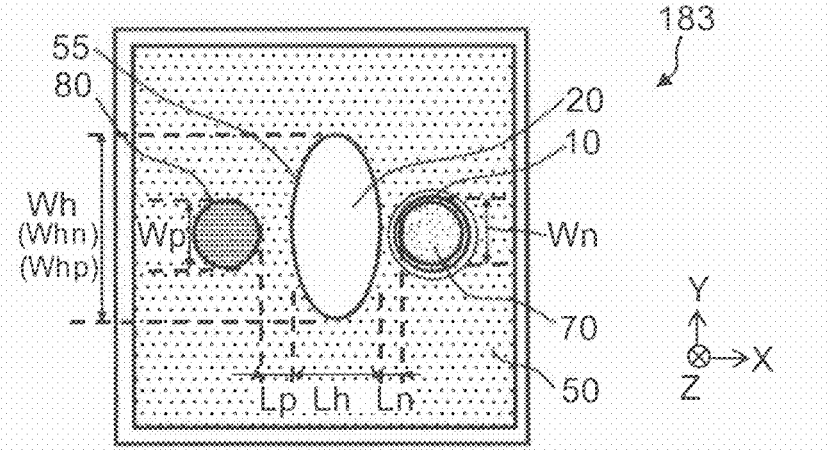

FIG. 15A to FIG. 15C are schematic plan views illustrating the configuration of another semiconductor light emitting devices according to the embodiment.

As illustrated in FIG. 15A, in a semiconductor light emitting device 181 according to the embodiment, the width of a hole 55 along the X-axis is small at the center portion along the Y-axis. In this example, the plane shape of the corners of the hole 55 is round. However, the corner may not be round.

As illustrated in FIG. 15B, in a semiconductor light emitting device 182 according to the embodiment, the plane shape of a hole 55 is a rectangle with round corners. In the specific example, the plane shape of the hole 55 may be a rectangle with corners that are not round.

As illustrated in FIG. 15C, in a semiconductor light emitting device 183 according to the embodiment, the plane shape of a hole 55 is a flat circle (including ellipses). In the specific example, the plane shape of the hole 55 may be a circular shape.

Also in the semiconductor light emitting devices 181 to 183, the width Wh is longer than the width Wn and the width Wp. The distance Ln is the distance Lp or less. Thus, it is possible to improve light extraction efficiency, and it is possible to obtain a highly efficient semiconductor light emitting device.

Figure 16A:
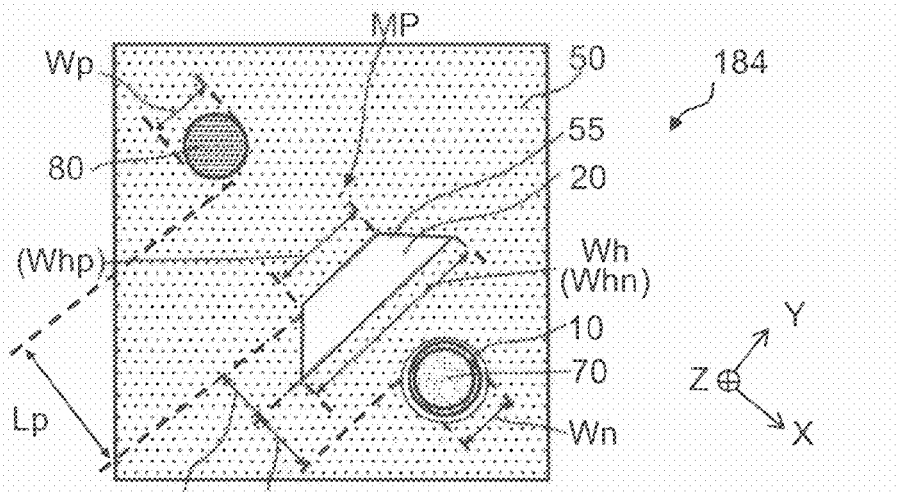
FIG. 16A to FIG. 16C are schematic plan views illustrating the configuration of another semiconductor light emitting devices according to the embodiment.
Figure 16B:
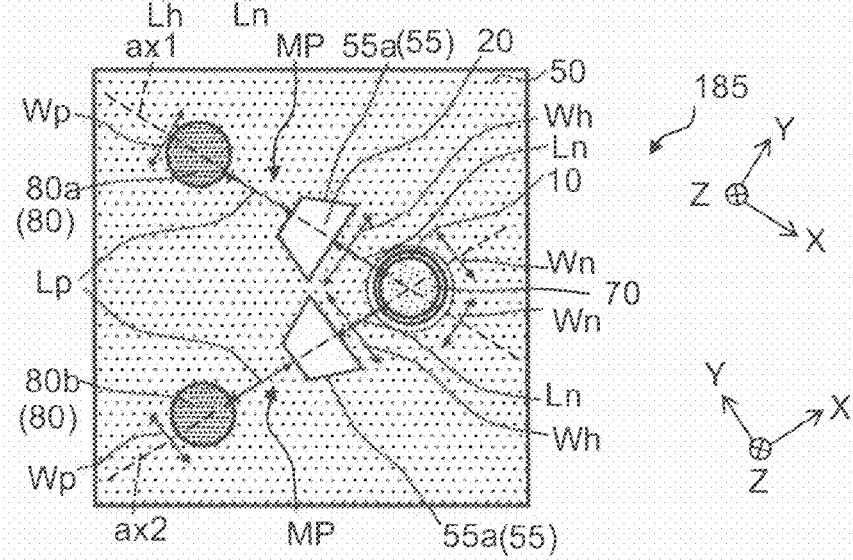
Figure 16C:
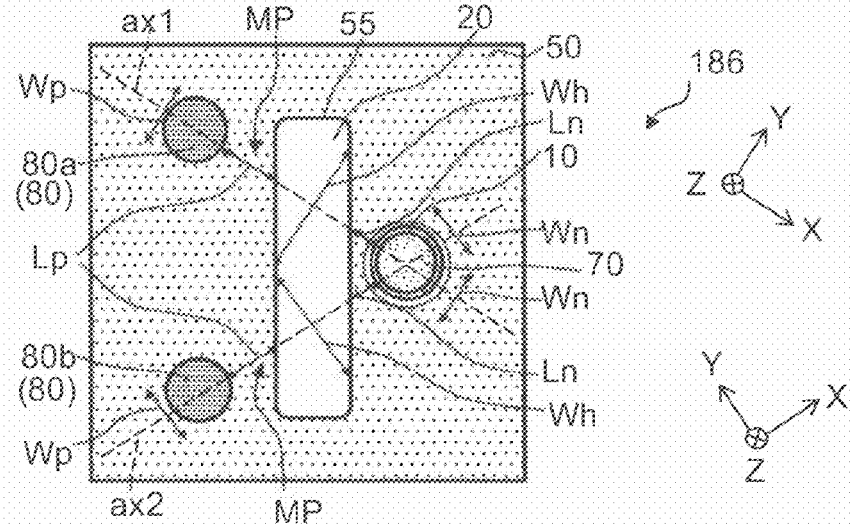

FIG. 16A to FIG. 16C are schematic plan views illustrating the configuration of another semiconductor light emitting devices according to the embodiment.

As illustrated in FIG. 16A, in a semiconductor light emitting device 184 according to the embodiment, a p-side electrode 80 is disposed near one of two diagonal corners in a plane and an n-side electrode 70 is disposed near the other when the semiconductor light emitting device 184 is seen along the Z-axis.

Namely, the X-axis (the second axis) connecting the p-side electrode 80 to the n-side electrode 70 is tilted to the side of the outer edge of the semiconductor light emitting device 184. Also in the semiconductor light emitting device 184, the width Wh is longer than the width Wn and the width Wp. The distance Ln is the distance Lp or less.

As described above, the disposition of the p-side electrode 80 and the n-side electrode 70 in the X-Y plane is optional. It is noted that the distance Ln may be set shorter than the distance Lp, as in this example.

As illustrated in FIG. 16B, in a semiconductor light emitting device 185 according to the embodiment, a plurality of p-side electrodes 80 (a first p-side electrode 80a and a second p-side electrode 80b) are provided. At this time, an axis ax1 connecting these electrodes is a first axis when attention is paid to the first p-side electrode 80a and an n-side electrode 70. An axis perpendicular to the axis ax1 and the Z-axis is a second axis. A first hole 55a is provided between the first p-side electrode 80a and the n-side electrode 70. When attention is paid to the first p-side electrode 80a, the n-side electrode 70, and the first hole 55a, the width Wh is longer than the width Wn and the width Wp. The distance Ln is the distance Lp or less. The distance Ln may be set shorter than the distance Lp. Thus, it is possible to effectively suppress a current carried through the middle portion MP between the first p-side electrode 80a and the n-side electrode 70, and it is possible to effectively enhance the current density Jz of the peripheral portion PP.

Similarly, when attention is paid to the second p-side electrode 80b and the n-side electrode 70, an axis ax2 connecting these electrodes is a first axis. An axis perpendicular to the axis ax2 and the Z-axis is a second axis. A second hole 55b is provided between the second p-side electrode 80a and the n-side electrode 70. When attention is paid to the second p-side electrode 80a, the n-side electrode 70, and the second hole 55b, the width Wh is longer than the width Wn and the width Wp. The distance Ln is the distance Lp or less. The distance Ln may be set shorter than the distance Lp. Thus, it is possible to effectively suppress a current carried through the middle portion MP between the second p-side electrode 80b and the n-side electrode 70, and it is possible to effectively enhance the current density Jz of the peripheral portion PP.

As illustrated in FIG. 16C, in a semiconductor light emitting device 186 according to the embodiment, a plurality of p-side electrodes 80 (a first p-side electrode 80a and a second p-side electrode 80b) are provided. A single hole 55 is provided between the first p-side electrode 80a and an n-side electrode 70.

In this case, an axis ax1 connecting the first p-side electrode 80a and the n-side electrode 70 is a first axis, and an axis perpendicular to the axis ax1 and the Z-axis is a second axis. When attention is paid to the first p-side electrode 80a, the n-side electrode 70, and the hole 55, the width Wh is longer than the width Wn and the width Wp. The distance Ln is the distance Lp or less. The distance Ln may be set shorter than the distance Lp.

Similarly, an axis ax2 connecting the second p-side electrode 80b and the n-side electrode 70 is a first axis, and an axis perpendicular to the axis ax2 and the Z-axis is a second axis. When attention is paid to the second p-side electrode 80a, the n-side electrode 70, and the hole 55, the width Wh is longer than the width Wn and the width Wp. The distance Ln is the distance Lp or less. The distance Ln may be set shorter than the distance Lp.

Also in the semiconductor light emitting device 186, it is possible to effectively suppress a current carried through the middle portion MP between the first p-side electrode 80a and the n-side electrode 70 and a current carried through the middle portion MP between the second p-side electrode 80b and the n-side electrode 70, and it is possible to effectively enhance the current density Jz of the peripheral portion PP.

In the semiconductor light emitting devices 185 and 186, two p-side electrodes 80 are provided. However, the embodiment is not limited thereto. The number of the p-side electrode 80 is optional.

A plurality of n-side electrodes 70 may be further provided. Also in this case, for example, when attention is paid to one of the plurality of p-side electrodes 80 and one of the plurality of n-side electrodes 70, an axis connecting them can be set to a second axis, and an axis perpendicular to the first axis (the Z-axis) and the second axis can be set to a third axis. At this time, a hole 55 is provided between the p-side electrode 80 and the n-side electrode 70, to which attention is paid, the width Wh is set longer than the width Wn and the width Wp, and the distance Ln is set shorter than the distance Lp. The distance Ln may be set shorter than the distance Lp. Thus, it is possible to effectively suppress a current carried through the middle portion MP between the p-side electrode 80 and the n-side electrode 700, to which attention is paid, and it is possible to effectively enhance the current density Jz of the peripheral portion PP. Therefore, it is possible to improve light extraction efficiency, and it is possible to obtain a highly efficient semiconductor light emitting device.

FIG. 17A to FIG. 17D are schematic views illustrating the configuration of another semiconductor light emitting devices according to the embodiment.

FIG. 17A is a schematic cross-sectional view illustrating semiconductor light emitting devices 131 to 133 according to the embodiment. FIG. 17B to FIG. 17D are schematic plan views illustrating the semiconductor light emitting devices 131 to 133.

As illustrated in FIG. 17A, in the semiconductor light emitting devices 131 to 133 according to the embodiment, a stacked structure unit 10s has a recess 15. The recess 15 is connected to a hole 55 provided in a transparent electrode 50. The recess 15 penetrates a p-type semiconductor layer 20 and a light emitting portion 30 along the Z-axis to reach an n-type semiconductor layer 10. Since the configurations other than this are the same as the configuration of the semiconductor light emitting device 110, the description is omitted.

In these examples, the plane shape (the shape when seen along the Z-axis) of the recess 15 is substantially the same as the plane shape of the hole 55 (the shape when seen along the Z-axis).

As illustrated in FIG. 17B to FIG. 17D, in the semiconductor light emitting devices 131 to 133, the plane shape of the hole 55 is a trapezoid. In these examples, the width Whp of the hole 55 on the p-side electrode 80 side is 40 μm. The width Whn of the hole 55 on the n-side electrode 70 side is 240 μm. The length Lh of the hole 55 along the X-axis is 80 μm.

In the semiconductor light emitting devices 131 to 133, the position of the hole 55 along the X-axis is changed. In the semiconductor light emitting device 131, the distance Ln is 65 μm, and the distance Lp is 25 μm. In the semiconductor light emitting device 132, the distance Ln is 25 μm, and the distance Lp is 65 μm. In the semiconductor light emitting device 173, the distance Ln is 45 μm, and the distance Lp is 45 μm. Namely, the semiconductor light emitting devices 131 to 133 correspond to devices provided with the recess 15 in the semiconductor light emitting devices 171 to 173 illustrated in FIG. 13A to FIG. 13D.

Figure 18:
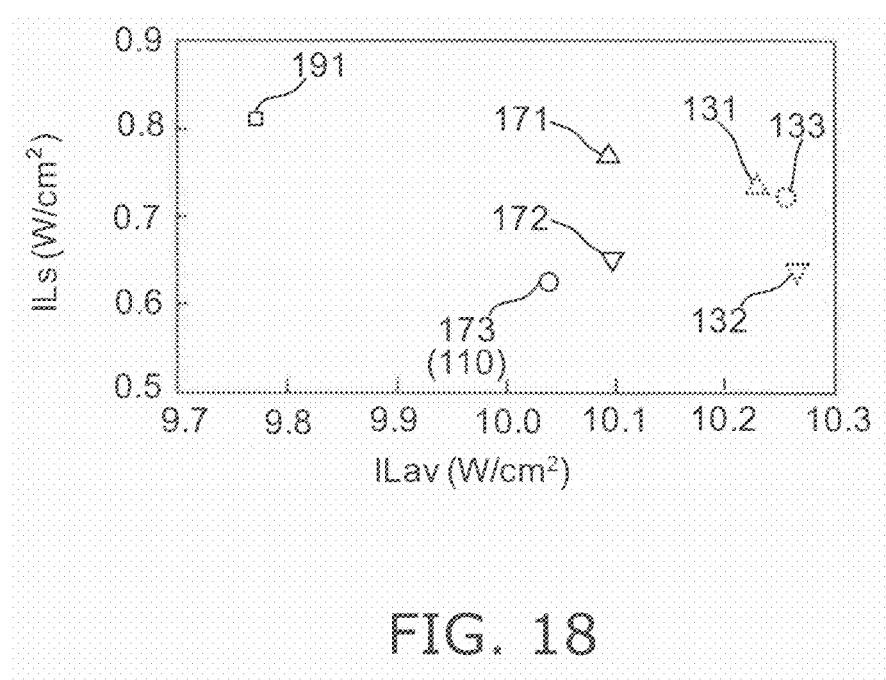
FIG. 18 is a graph illustrating the characteristics of the semiconductor light emitting devices.

FIG. 18 is a graph illustrating the characteristics of the semiconductor light emitting devices.

As illustrated in FIG. 18, also in any of the semiconductor light emitting devices 131 to 133, a higher average light emitting intensity ILav can be obtained than in the semiconductor light emitting device 191.

When a comparison is made with the semiconductor light emitting devices 171 to 173 provided with no recess 15, in the semiconductor light emitting devices 131 to 133, a high average light emitting intensity ILav can be obtained.

The standard deviation ILs is more improved as well as the average light emitting intensity ILav is more greatly improved particularly in the semiconductor light emitting device 172 than in the semiconductor light emitting device 132.

As described above, more preferably, the stacked structure unit 10s is provided with the recess 15. Particularly, the recess 15 is provided as well as the distance Ln is set to the distance Lp or less like the semiconductor light emitting device 132, so that it is possible to greatly improve the standard deviation ILs and the average light emitting intensity ILay.

FIG. 19A to FIG. 19C are schematic cross-sectional views illustrating the configuration of another semiconductor light emitting devices according to the embodiment.

As illustrated in FIG. 19A, in a semiconductor light emitting device 134 according to the embodiment, a recess 15 provided in a stacked structure unit 10s is provided in a p-type semiconductor layer 20, not reaching a light emitting portion 30. Also in this case, in the middle portion MP where the hole 55 is provided, a current path is narrowed.

As illustrated in FIG. 19B, in a semiconductor light emitting device 135 according to the embodiment, a recess 15 provided in a stacked structure unit 10s penetrates a p-type semiconductor layer 20 along the Z-axis, reaching a light emitting portion 30. In the middle portion MP where the hole 55 is provided, a current path is more effectively narrowed.

As illustrated in FIG. 19C, in a semiconductor light emitting device 136 according to the embodiment, a recess 15 provided in a stacked structure unit 10s penetrates a p-type semiconductor layer 20 and a light emitting portion 30 along the Z-axis, reaching an n-type semiconductor layer 10. The recess 15 is also provided in a part of the n-type semiconductor layer 10. In the middle portion MP where the hole 55 is provided, a current path is much more effectively narrowed.

In the aforementioned semiconductor light emitting devices 131 to 136, the plane shape of the hole 55 is a trapezoid. However, also in the case where the recess 15 is provided in the stacked structure unit 10s, the plane shape of the transparent electrode 50 is optional.

According to the embodiment, it is possible to provide a highly efficient semiconductor light emitting device.

In the specification, the term "nitride semiconductor" includes semiconductors having all compositions in which composition ratios x, y, and z are changed within the ranges in a chemical formula $B_xIn_yAl_zGa_{1-x-y-z}N$ ($0 \leq x \leq 1$, $0 \leq y \leq 1$, $0 \leq z \leq 1$, $x+y+z \leq 1$). The term "nitride semiconductor" also includes, in the chemical formula, those further including V group elements other than N (nitrogen), those further including various elements added to control various physical properties such as a conductive type, and those further including various elements contained unintentionally.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

As described above, the embodiment according to the invention is explained with reference to specific examples. However, the invention is not limited to these specific examples. As for the specific configurations of the components such as the n-type semiconductor layer, the light emitting portion, the p-type semiconductor layer, the stacked structure unit, the p-side electrode, the n-side electrode, the hole, and the recess, for example, included in the semiconductor light emitting device, they are included in the scope of the invention as long as a person skilled in the art may appropriately select them from a publicly known range and similarly implement the invention for obtaining similar effects.

Further, any two or more components of the specific examples may be combined within the extent of technical feasibility and are included in the scope of the invention to the extent that the purport of the invention is included.

In addition to this, all semiconductor light emitting devices that can be implemented by a person skilled in the art to appropriately modify and alter design based on the foregoing semiconductor light emitting devices described as an embodiment of the invention are also included in the scope of the invention as long as they include the teachings of the invention.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device comprising:
   a stacked structure unit including:
      an n-type semiconductor layer;
      a light emitting portion provided on a part of the n-type semiconductor layer; and
      a p-type semiconductor layer provided on the light emitting portion, an axis from the p-type semiconductor layer toward the n-type semiconductor being defined as a first axis;
   a transparent electrode provided on the p-type semiconductor layer and electrically connected to the p-type semiconductor layer;
   a p-side electrode provided on the transparent electrode and electrically connected to the transparent electrode; and
   an n-side electrode provided on the n-type semiconductor layer and electrically connected to the n-type semiconductor layer, an axis from the p-side electrode toward the n-side electrode being defined as a second axis,
   the transparent electrode having a hole provided between the n-side electrode and the p-side electrode,
   the hole penetrating the transparent electrode along the first axis,
   a width of the hole along a third axis being longer than a width of the n-side electrode along the third axis and being longer than a width of the p-side electrode along the third axis, the third axis being perpendicular to the second axis and being perpendicular to the first axis,
   a distance between the hole and the n-side electrode along the second axis being not longer than a distance between the hole and the p-side electrode along the second axis.

2. The device according to claim 1,
   wherein the stacked structure unit has a recess connected to the hole.

3. The device according to claim 2,
   wherein the recess penetrates the p-type semiconductor layer along the first axis, and reaches the light emitting portion.

4. The device according to claim 2,
   wherein the recess penetrates the p-type semiconductor layer and the light emitting portion along the first axis, and reaches the n-type semiconductor layer.

5. The device according to claim 1, wherein a thickness of the transparent electrode is not less than 0.1 micrometers and not more than 0.5 micrometers.

6. The device according to claim 1, wherein the transparent electrode includes an oxide containing at least one element selected from the group consisting of In, Sn, Zn and Ti.

7. The device according to claim 1, wherein the n-type semiconductor layer and the p-type semiconductor layer include a nitride semiconductor.

8. The device according to claim 1, wherein
   the n-type semiconductor layer includes an n-type GaN layer, and
   the p-type semiconductor layer includes a p-type GaN layer.

9. The device according to claim 1, wherein a plane shape of the hole is trapezoidal.

10. The device according to claim 1, wherein a peak wavelength of light emitted from the light emitting portion is not less than 400 nanometers and not more than 650 nanometers.

11. A semiconductor light emitting device comprising:
    a stacked structure unit including:
       an n-type semiconductor layer;
       a light emitting portion provided on a part of the n-type semiconductor layer; and
       a p-type semiconductor layer provided on the light emitting portion, an axis from the p-type semiconductor layer toward the n-type semiconductor being defined as a first axis;
    a transparent electrode provided on the p-type semiconductor layer and electrically connected to the p-type semiconductor layer,
    a p-side electrode provided on the transparent electrode and electrically connected to the transparent electrode; and
    an n-side electrode provided on the n-type semiconductor layer and electrically connected to the n-type semiconductor layer, an axis from the p-side electrode toward the n-side electrode being defined as a second axis,
    the transparent electrode having a hole provided between the n-side electrode and the p-side electrode,
    the hole penetrating the transparent electrode along the first axis,
    a width of the hole along a third axis being longer than a width of the n-side electrode along the third axis and being longer than a width of the p-side electrode along the third axis, the third axis being perpendicular to the second axis and being perpendicular to the first axis,
    a width of the hole on a side of the n-side electrode along the third axis being longer than a width of the hole on a side of the p-side electrode along the third axis.

12. The device according to claim 11,
    wherein a distance between the hole and the n-side electrode along the second axis is not longer than a distance between the hole and the p-side electrode along the second axis.

13. The device according to claim 11,
    wherein the stacked structure unit has a recess connected to the hole.

14. The device according to claim 13,
wherein the recess penetrates the p-type semiconductor layer along the first axis, and reaches the light emitting portion.

15. The device according to claim 13,
wherein the recess penetrates the p-type semiconductor layer and the light emitting portion along the first axis, and reaches the n-type semiconductor layer.

16. The device according to claim 11, wherein a thickness of the transparent electrode is not less than 0.1 micrometers and not more than 0.5 micrometers.

17. The device according to claim 11, wherein the transparent electrode includes an oxide containing at least one element selected from the group consisting of In, Sn, Zn and Ti.

18. The device according to claim 11, wherein
the n-type semiconductor layer includes an n-type GaN layer, and
the p-type semiconductor layer includes a p-type GaN layer.

19. The device according to claim 11, wherein a plane shape of the hole is trapezoidal.

20. The device according to claim 11, wherein a peak wavelength of light emitted from the light emitting portion is not less than 400 nanometers and not more than 650 nanometers.

* * * * *